(12) United States Patent
Koyama

(10) Patent No.: US 7,893,517 B2
(45) Date of Patent: Feb. 22, 2011

(54) SEMICONDUCTOR DEVICE WITH BLOCK LAYER AND METHOD OF MANUFACTURING THE SAME

(75) Inventor: Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 349 days.

(21) Appl. No.: 11/947,429

(22) Filed: Nov. 29, 2007

(65) Prior Publication Data

US 2008/0128805 A1 Jun. 5, 2008

(30) Foreign Application Priority Data

Nov. 30, 2006 (JP) ............................. 2006-324619

(51) Int. Cl.
*H01L 21/70* (2006.01)
(52) U.S. Cl. ........................ 257/500; 257/501
(58) Field of Classification Search ............. 257/500, 257/501
See application file for complete search history.

(56) References Cited

U.S. PATENT DOCUMENTS 6,194,772 B1 * 2/2001 Tung .......................... 257/501

| 2007/0045737 A1 | 3/2007 | Noda et al. |
| 2007/0069326 A1 | 3/2007 | Yoshizumi et al. |
| 2007/0096246 A1 | 5/2007 | Akiba et al. |

FOREIGN PATENT DOCUMENTS

JP        2006-40907        2/2006

* cited by examiner

*Primary Examiner*—Phat X Cao
(74) *Attorney, Agent, or Firm*—Turocy & Watson, LLP

(57) ABSTRACT

A semiconductor memory device includes a well layer having a first conductivity type and formed in a semiconductor substrate, a block layer formed in a trench and formed of an insulating layer, a gate electrode formed on the semiconductor substrate apart from the block layer, a first diffusion layer having a second conductivity type, formed on a surface of the semiconductor substrate, and having a high impurity concentration region to a first depth from the surface of the semiconductor substrate, a second diffusion layer having the second conductivity type, formed on the surface of the semiconductor substrate on a side of the block layer away from the gate electrode, having a high impurity concentration region to a second depth greater than the first depth from the surface of the semiconductor substrate, and electrically connected to the first diffusion layer, and a contact connected to the second diffusion layer.

13 Claims, 14 Drawing Sheets

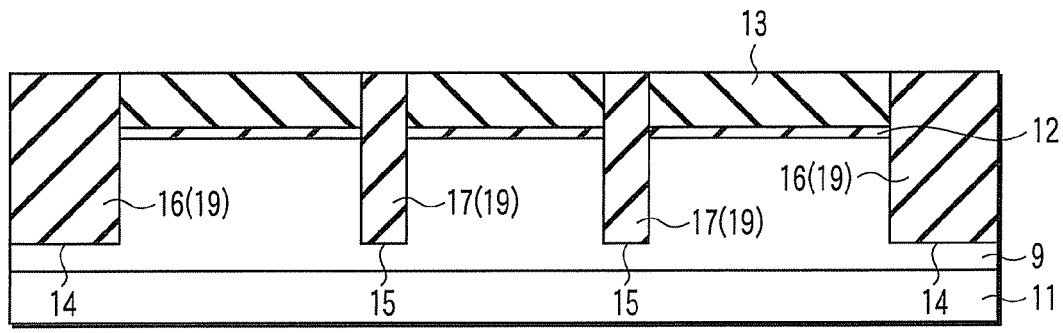
F I G. 7
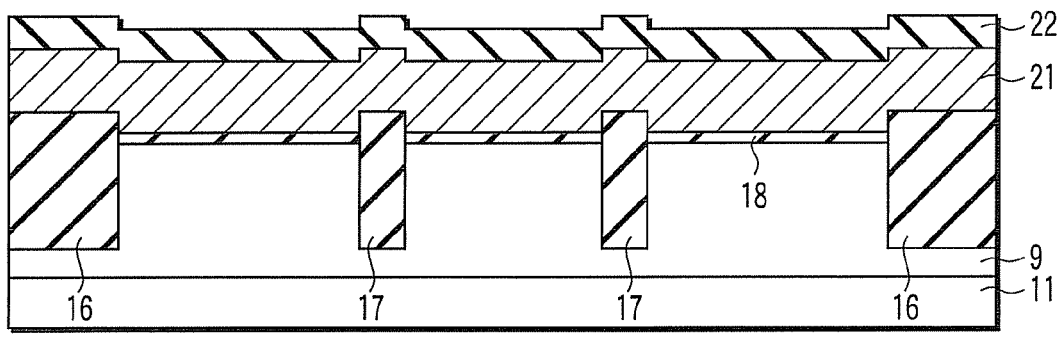
F I G. 8
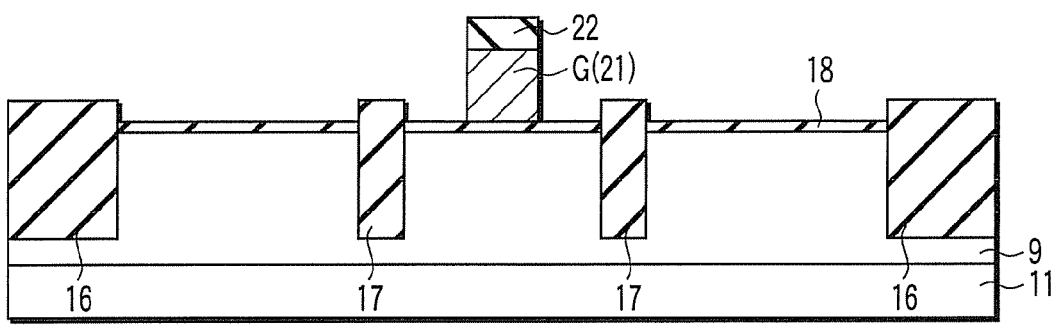
F I G. 9

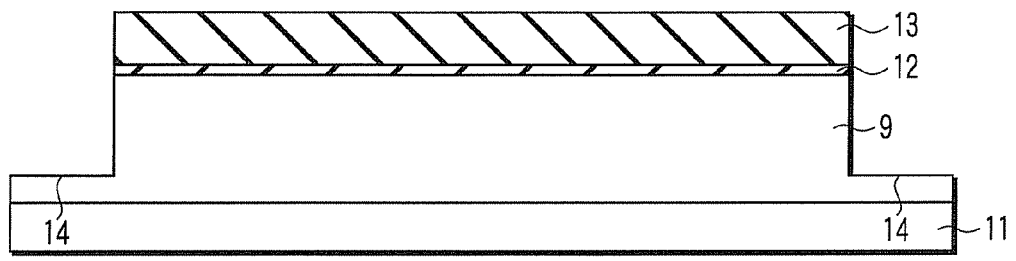
F I G. 21
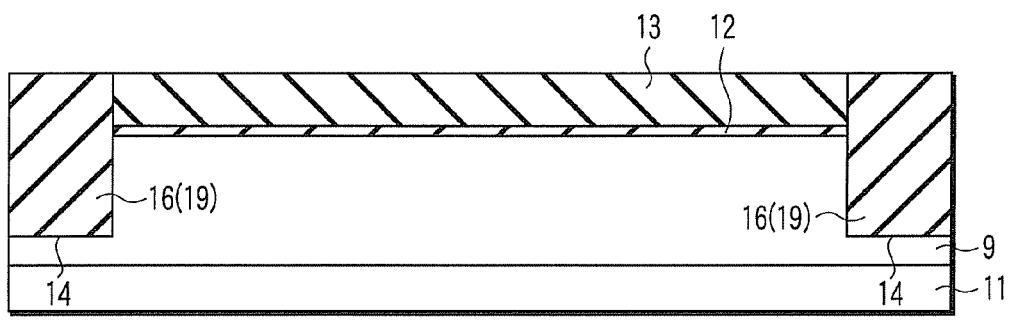
F I G. 22
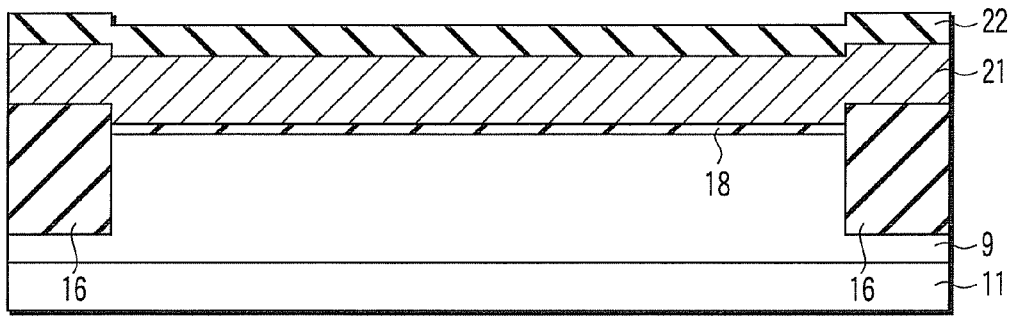
F I G. 23
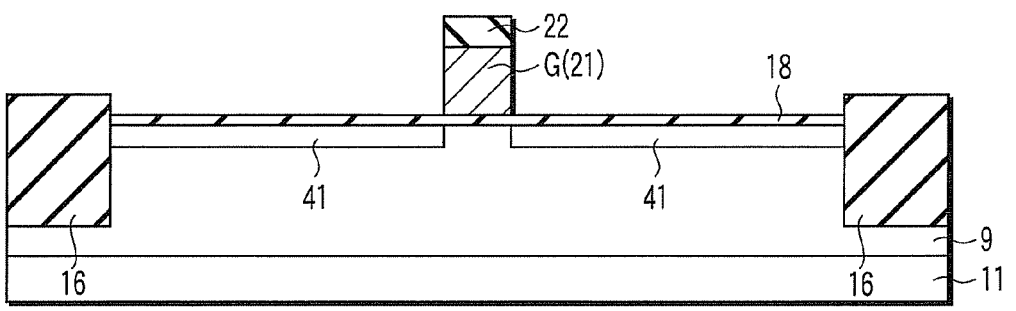
F I G. 24

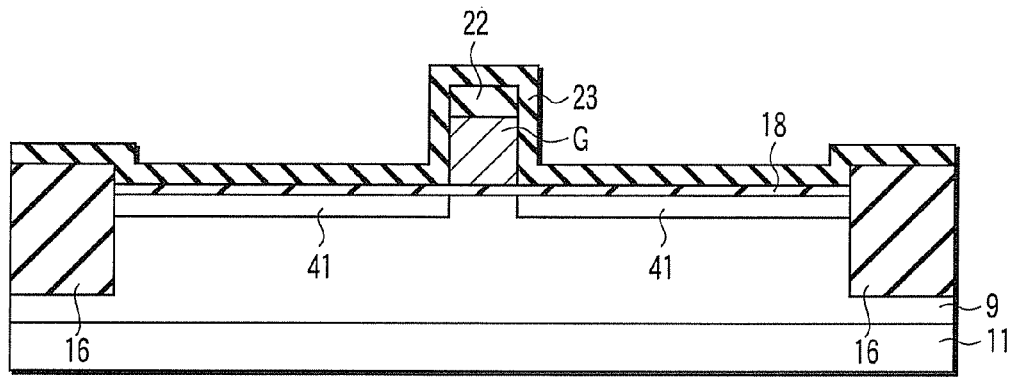
F I G. 25
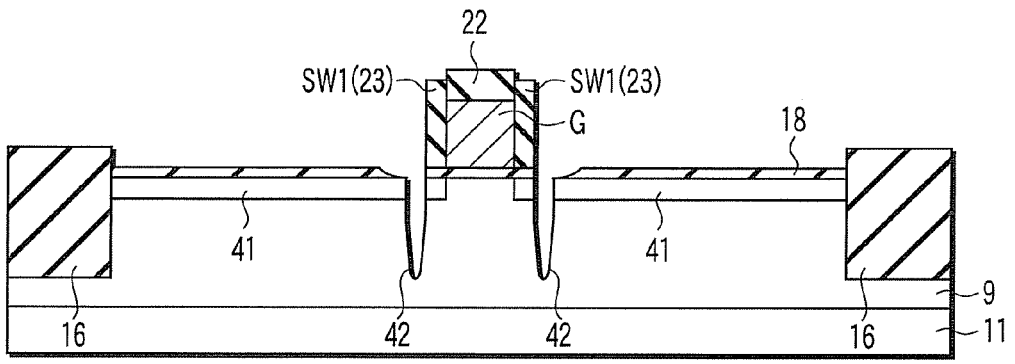
F I G. 26A
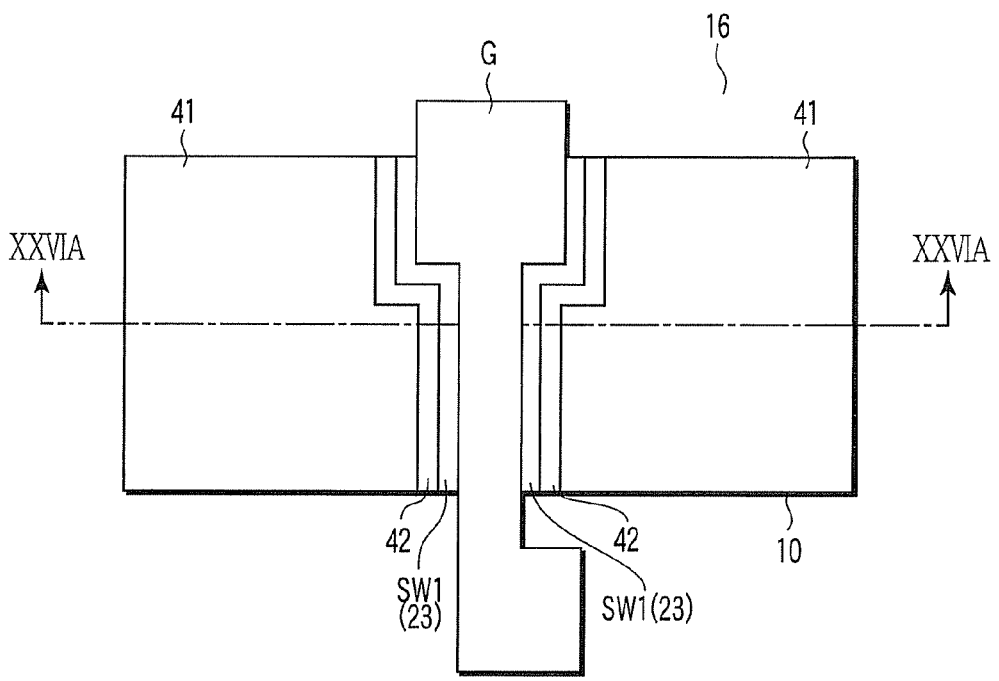
F I G. 26B

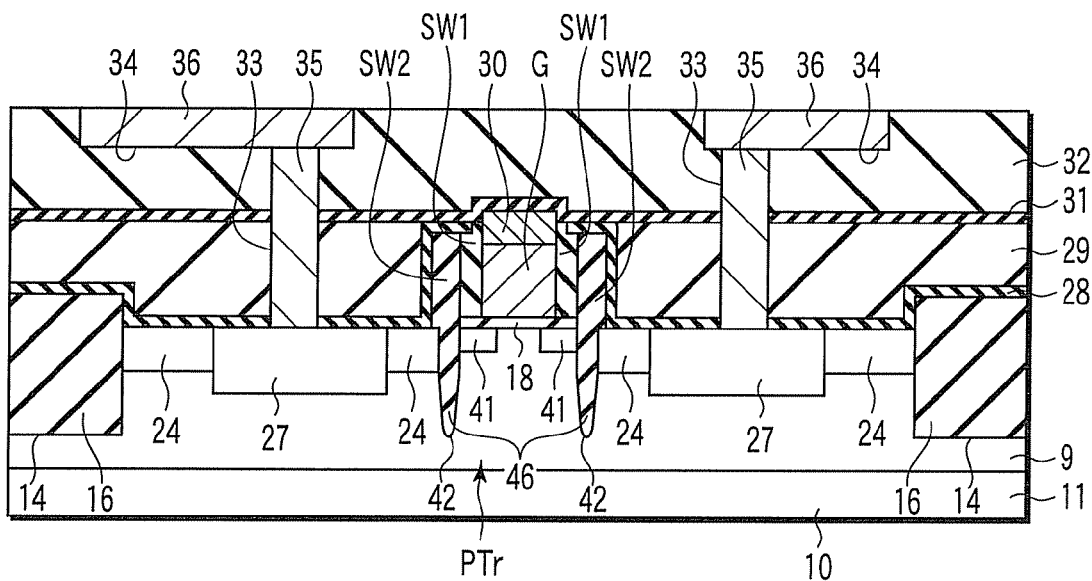
F I G. 31
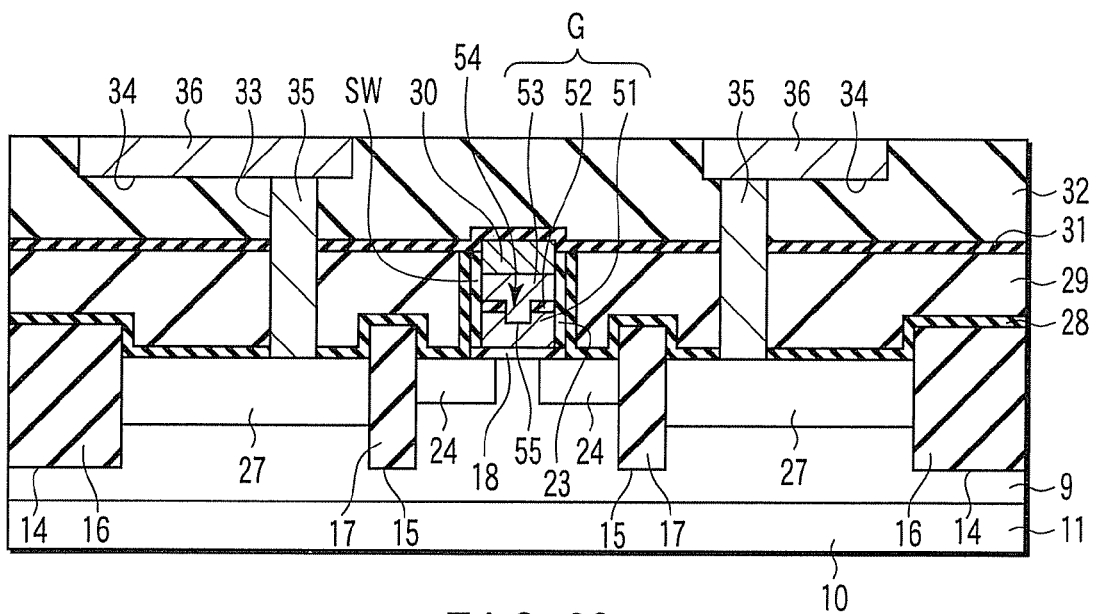
F I G. 32

SEMICONDUCTOR DEVICE WITH BLOCK LAYER AND METHOD OF MANUFACTURING THE SAME

CROSS-REFERENCE TO RELATED APPLICATIONS

This application is based upon and claims the benefit of priority from prior Japanese Patent Application No. 2006-324619, filed Nov. 30, 2006, the entire contents of which are incorporated herein by reference.

BACKGROUND OF THE INVENTION

1. Field of the Invention

The present invention relates to a semiconductor memory device in which the impurity concentration in a diffusion layer connected to a contact has a high concentration region, and a method of manufacturing the same.

2. Description of the Related Art

A circuit including both a PMOS transistor and NMOS transistor is used in a CMOS device such as a NAND flash memory. Impurity diffusion layers formed in the surface of a semiconductor substrate are used as the source and drain of the transistor. The impurity diffusion layers are formed using an impurity represented by boron in the PMOS transistor, and an impurity represented by arsenic in the NMOS transistor.

The resistance of a contact connected to the impurity diffusion layer has the following problem in the PMOS transistor of the CMOS device.

The diffusion coefficient of boron used in the PMOS transistor is larger than that of arsenic used in the NMOS transistor. To suppress the short-channel effect, therefore, the acceleration energy when implanting boron must be decreased such that a high concentration region of the impurity concentration exists closer to the substrate surface than that in the impurity diffusion layers of the NMOS transistor.

On the other hand, arsenic used in the NMOS transistor is implanted so that the impurity high concentration region exists in a position slightly deeper than the substrate surface, in order to decrease the variation in total amount of impurities implanted into the substrate, and decrease the parasitic resistance between the source and drain of the transistor.

Accordingly, the impurity concentrations in the diffusion layers of the NMOS transistor and PMOS transistor have different the depth of the high concentration region; the impurity high concentration region in the diffusion layer is shallower in the PMOS transistor than in the NMOS transistor.

Under the circumstances, a contact hole to be connected to an upper interconnection layer is formed on the diffusion layer. In this case, in order to ensure the continuity yield between the contact and impurity diffusion layer, overetching is performed in addition to the etching time corresponding to the depth of the contact. Consequently, the surface of the semiconductor substrate is etched at the opening of the contact hole. This sometimes decreases the impurity concentration in the surface at the opening of the contact hole particularly in the PMOS transistor. This decrease in impurity concentration raises the contact resistance between the substrate and contact.

Note that prior art reference information related to the invention of this application is as follows.

[Patent Reference 1] Jpn. Pat. Appln. KOKAI Publication No. 2006-40907

BRIEF SUMMARY OF THE INVENTION

A semiconductor memory device according to the first aspect of the present invention comprising a semiconductor substrate having a trench, a well layer having a first conductivity type and formed in the semiconductor substrate, a block layer formed in the trench and formed of an insulating layer, a gate electrode formed on the semiconductor substrate apart from the block layer, a first diffusion layer having a second conductivity type, formed on a surface of the semiconductor substrate, and having a high concentration region of an impurity concentration to a first depth from the surface of the semiconductor substrate, a second diffusion layer having the second conductivity type, formed on the surface of the semiconductor substrate on a side of the block layer away from the gate electrode, having a high concentration region of an impurity concentration to a second depth greater than the first depth from the surface of the semiconductor substrate, and electrically connected to the first diffusion layer in contact therewith, and a contact connected to the second diffusion layer.

A semiconductor memory device manufacturing method according to the second aspect of the present invention comprising forming a well layer having a first conductivity type in a semiconductor substrate, forming a trench in the semiconductor substrate, forming a block layer by burying an insulating layer in the trench, forming a gate electrode on a gate insulating film on the semiconductor substrate apart from the block layer, forming, in a surface of the semiconductor substrate, a first diffusion layer having a second conductivity type and having a high concentration region of an impurity concentration to a first depth from the surface of the semiconductor substrate, forming, in the surface of the semiconductor substrate on a side of the block layer away from the gate electrode, a second diffusion layer having the second conductivity type and having a high concentration region of an impurity concentration to a second depth greater than the first depth from the surface of the semiconductor substrate, and forming a contact connecting to the second diffusion layer.

A semiconductor memory device manufacturing method according to the third aspect of the present invention comprising forming a well layer having a first conductivity type in a semiconductor substrate, forming a gate electrode on a gate insulating film on the semiconductor substrate, forming a first diffusion layer having a second conductivity type in a surface of the semiconductor substrate, forming a first insulating layer on the semiconductor substrate and the gate electrode, forming a first sidewall insulating film on a side surface of the gate electrode by etching the first insulating layer, forming a trench in the semiconductor substrate by etching the semiconductor substrate on a side of the gate electrode, forming a second diffusion layer having the second conductivity type around a portion of the trench in the semiconductor substrate, forming a second sidewall insulating film consisting of a second insulating layer on a side surface of the first sidewall insulating film, and forming a block layer consisting of the second insulating layer in the trench, forming, in a surface of the semiconductor substrate on a side of the block layer away from the gate electrode, a third diffusion layer having the second conductivity type and having a high concentration region of an impurity concentration to a first depth from the surface of the semiconductor substrate, forming, in a partial region of the third diffusion layer, a fourth diffusion layer having the second conductivity type and having a high concentration region of an impurity concentration to a second depth greater than the first depth from the surface of the semiconductor substrate, and forming a contact connecting to the fourth diffusion layer.

BRIEF DESCRIPTION OF THE SEVERAL VIEWS OF THE DRAWING

FIGS. 6 to 13 are sectional views showing manufacturing steps of the semiconductor memory device having the PMOS transistor according to the first embodiment of the present invention;

FIGS. 21 to 25 are sectional views showing manufacturing steps of the semiconductor memory device having the PMOS transistor according to the second embodiment of the present invention;

FIG. 26A is a sectional view following FIG. 25 and showing a manufacturing step of the semiconductor memory device having the PMOS transistor according to the second embodiment of the present invention;

FIG. 26B is a plan view of FIG. 26A;

FIG. 31 is a sectional view taken along line XXXI-XXXI in FIG. 30; and

FIG. 32 is a sectional view showing a semiconductor memory device of a flash memory according to the third embodiment of the present invention.

DETAILED DESCRIPTION OF THE INVENTION

Figure 1:
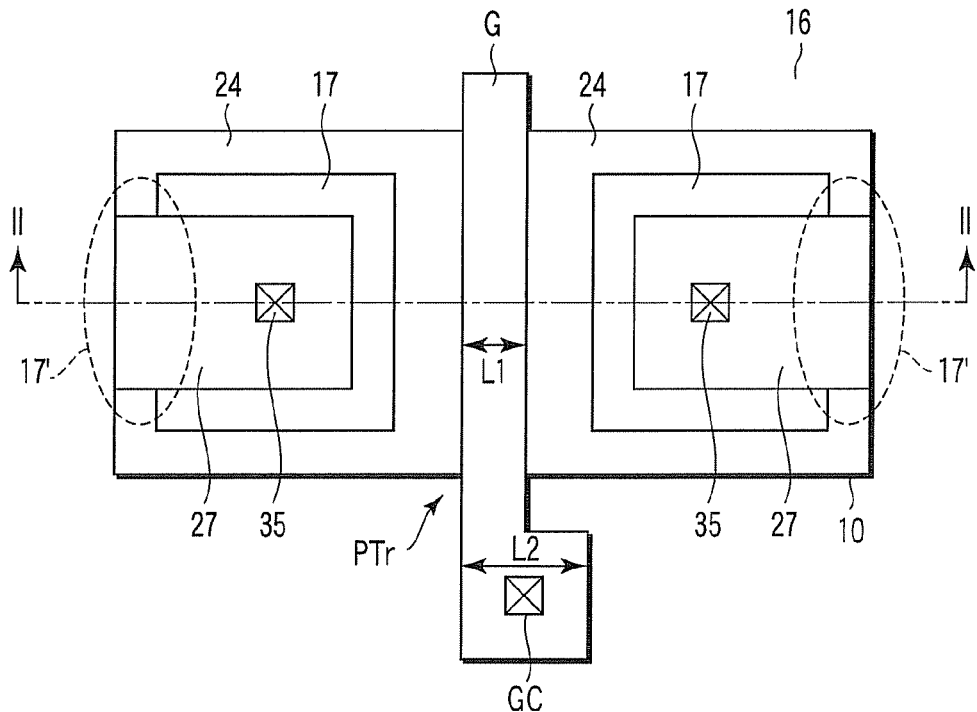
FIG. 1 is a schematic plan view of a semiconductor memory device having a PMOS transistor according to the first embodiment of the present invention.

The present inventor found the following by pursuing the cause of the problem that the contact resistance rises between a substrate and contact.

In a PMOS transistor used in a CMOS device or the like, for example, the short-channel effect is suppressed by setting maximum peak of the impurity concentration region in a diffusion layer near the surface of a semiconductor substrate (e.g., near a substrate depth of 10 nm), thereby decreasing the depth of the diffusion layer as much as possible. To allow the Fermi level to enter the valence band and well decrease the contact resistance between the diffusion layer and a metal, the impurity concentration in the diffusion layer is desirably $10^{20}$ $cm^{-3}$ or more. The present inventor found that the impurity concentration in the diffusion layer is $10^{20}$ $cm^{-3}$ or more within the range of about 20 nm from the substrate surface.

In each embodiment of the present invention, therefore, a diffusion layer of the impurity high concentration region exists to a position deeper than the conventional position from the substrate surface is formed around a contact, in order to avoid the rise in contact resistance even when a semiconductor substrate at the opening of the contact is etched by 20 nm or more.

Embodiments of the present invention as described above will be explained below with reference to the accompanying drawing. In the following explanation, the same reference numerals denote the same parts throughout the drawing.

First Embodiment

In the first embodiment, a diffusion layer in a region to be connected to a contact is formed by means of ion implantation so as to deepen the high concentration region of the impurity concentration, and an insulating block layer is formed in order to suppress the short-channel effect. The first embodiment will be explained below by taking a PMOS transistor used in a CMOS device or the like as an example.

Figure 2:
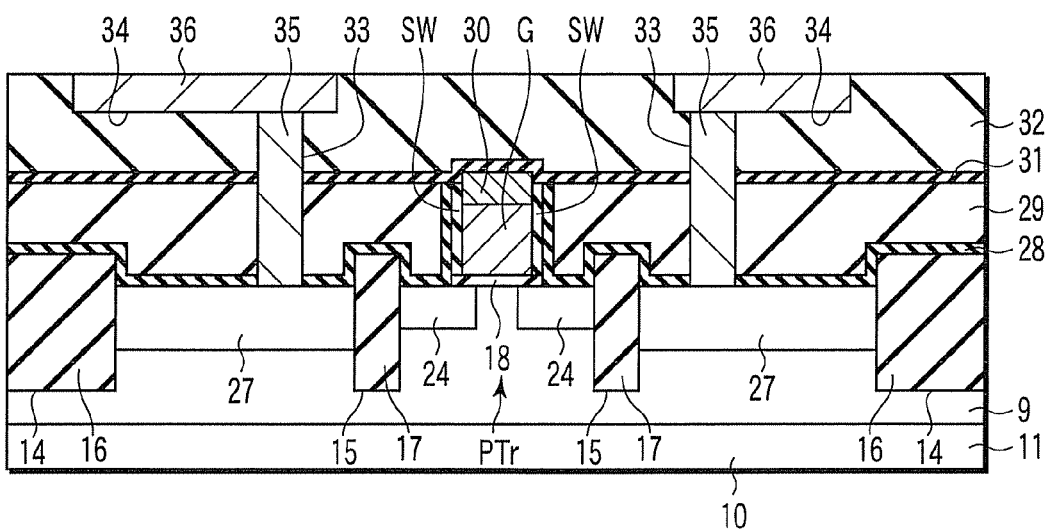
FIG. 2 is a sectional view taken along line II-II in FIG. 1.

FIG. 1 is a schematic plan view of a semiconductor memory device having a PMOS transistor according to the first embodiment of the present invention. FIG. 2 is a sectional view taken along line II-II in FIG. 1. The semiconductor memory device having a PMOS transistor according to the first embodiment will be explained below.

An n-well layer 9 is formed in a semiconductor substrate 11, and a trench 14 is formed in the semiconductor substrate 11. An element isolation insulating layer 16 having, e.g., the shallow trench isolation (STI) structure is formed in the trench 14. The element isolation insulating layer 16 isolates an element region 10.

Trenches 15 are formed in the element region 10, and insulating block layers 17 are formed in the trenches 15. The block layers 17 are formed within the element region 10, and are not in contact with the element isolation insulating layer 16. Each block layer 17 may be formed by the same insulating layer as or an insulating layer different from the element isolation insulating layer 16. The bottom surface of the block layer 17 may have the same depth as that of the bottom surface of the element isolation insulating layer 16 as shown in FIG. 2, and may also have a depth different from that of the bottom surface of the element isolation insulating layer 16. The upper surface of the block layer 17 may have the same height as that of the upper surface of the element isolation insulating layer 16, and may protrude from the upper surface of the semiconductor substrate 11.

The planar shape of the block layer 17 viewed from above is, e.g., a U-shape having an opening 17'. The opening 17' exists in a region where the opening 17' does not oppose a gate electrode G. Accordingly, the block layer 17 includes a first portion opposing the gate electrode G and extending parallel to the gate electrode G, and second portions extending away from the gate electrode G from the two end portions of the first portion.

The gate electrode G of a PMOS transistor PTr is formed on a gate insulating film 18 on the semiconductor substrate 11 between the two block layers 17 in the element region 10. The gate electrode G is spaced apart by, e.g., 100 nm or more from the block layer 17 by taking account of misalignment or the like. The gate electrode G extends onto the element isolation insulating layer 16 across the element region 10, and a gate contact GC is connected to the gate electrode G on the element isolation insulating layer 16. Gate length L2 of the gate electrode G, to which the gate contact GC is connected, on the element isolation insulating layer 16 may be greater than gate length L1 of the gate electrode G on the element region 10 as shown in FIG. 2, and may also be equal to gate length L1.

A pair of diffusion layers 24 are formed in the surface of the element region 10 on the two sides of the gate electrode G by diffusing a p-type impurity such as boron. A pair of diffusion layers 27 are formed in the surface of the element region 10 surrounded by the block layers 17 by diffusing a p-type impurity such as boron. The diffusion layers 24 and 27 are formed to be shallower than the bottom surfaces of the block layers 17. Accordingly, the diffusion layers 24 and 27 are not in contact with each other in regions where the block layers 17 exist, but in direct contact with each other at the openings 17' of the block layers 17. That is, the diffusion layers 24 and 27 are electrically connected to each other at the openings 17' of the block layers 17, thereby securing current paths without sandwiching any p-n junction.

Contacts 35 for applying a potential from upper interconnection layers 36 are connected to the diffusion layers 27. Although not accurately shown in FIG. 2, since the semiconductor substrate 11 is overetched when contact holes 33 are formed, the upper surfaces of the diffusion layers 27 where the contacts 35 exist are lower than the upper surface of the semiconductor substrate 11 in a region where the contacts 35 are not formed. The depth of the upper surface of each diffusion layer 27 varies around about 20 nm from the surface of the semiconductor substrate 11.

A silicide layer 30 is formed on the gate electrode G. The silicide layer 30 makes the sheet resistance of the gate electrode G lower than that of polysilicon by an order of magnitude or more, thereby decreasing the CR time constant. The silicide layer 30 consists of, e.g., cobalt silicide (CoSi), tungsten silicide (WSi), molybdenum silicide (MoSi), tantalum silicide (TaSi), titanium silicide (TiSi), nickel silicide (NiSi), or platinum silicide (PtSi).

Figure 3:
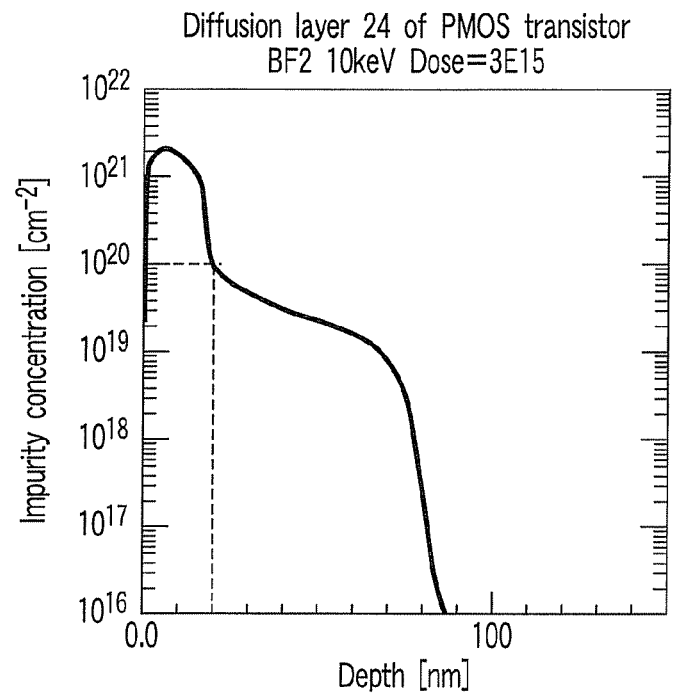
FIG. 3 is a graph showing the impurity profile in the direction of depth below a substrate in a p-type impurity diffusion layer 24 of a PMOS transistor according to each embodiment of the present invention.

FIG. 3 shows the impurity profile in the direction of depth below the substrate in the p-type impurity diffusion layer 24 of the PMOS transistor according to each embodiment of the present invention. This impurity profile is the result of simulation when ion-implanting $BF_2^+$ at 10 keV and 3E15 $cm^{-2}$ (first conditions) and performing activation annealing.

As shown in FIG. 3, the impurity concentration in the p-type diffusion layer 24 is highest near the substrate surface, and lowers as the depth from the substrate surface increases. The high concentration region range of the impurity concentration in diffusion layer 24 is about 20 nm from the surface of the semiconductor substrate 11. A maximum peak of the impurity concentration in diffusion layer 24 is positioned at a depth of about 10 nm from the surface of the semiconductor substrate 11. Note that the peak of the impurity concentration in each embodiment means the range within which the impurity concentration is as high as $10^{20}$ $cm^{-3}$ and the layer exhibits metallic properties.

Figure 4:
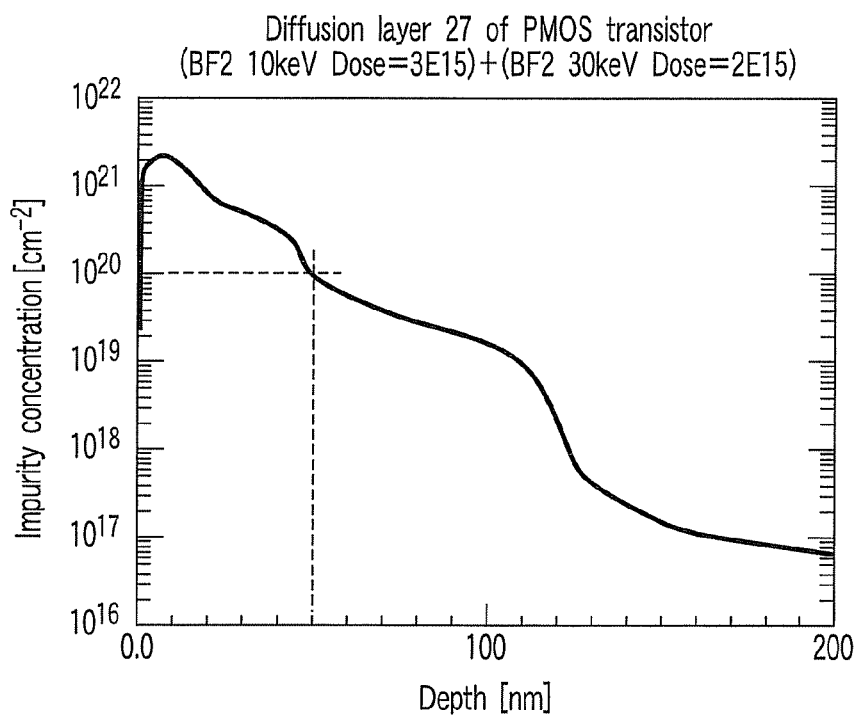
FIG. 4 is a graph showing the impurity profile in the direction of depth below a substrate in a p-type impurity diffusion layer 27 of the PMOS transistor according to each embodiment of the present invention.

FIG. 4 shows the impurity profile in the direction of depth below the substrate in the p-type impurity diffusion layer 27 of the PMOS transistor according to each embodiment of the present invention. This impurity profile is the result of simulation when ion-implanting $BF_2^+$ at 10 keV and 3E15 $cm^{-2}$ (first conditions), ion-implanting $BF_2^+$ at 30 keV and 2E15 $cm^{-2}$ (second conditions), and then performing activation annealing.

As shown in FIG. 4, the impurity concentration in the p-type diffusion layer 27 lowers as the depth from the substrate surface increases, but an impurity concentration of $10^{20}$ $cm^{-3}$ or more can be held to a depth of about 50 nm from the substrate surface. That is, the high concentration region of the impurity concentration in diffusion layer 27 is positioned at a depth of about 50 nm from the surface of the semiconductor substrate 11. Accordingly, the impurity high concentration region in diffusion layer 27 is deeper than that in diffusion layer 24. This is so because diffusion layer 27 is formed by further implanting an impurity under the second conditions in the region where diffusion layer 24 is formed under the first conditions.

Figure 5:
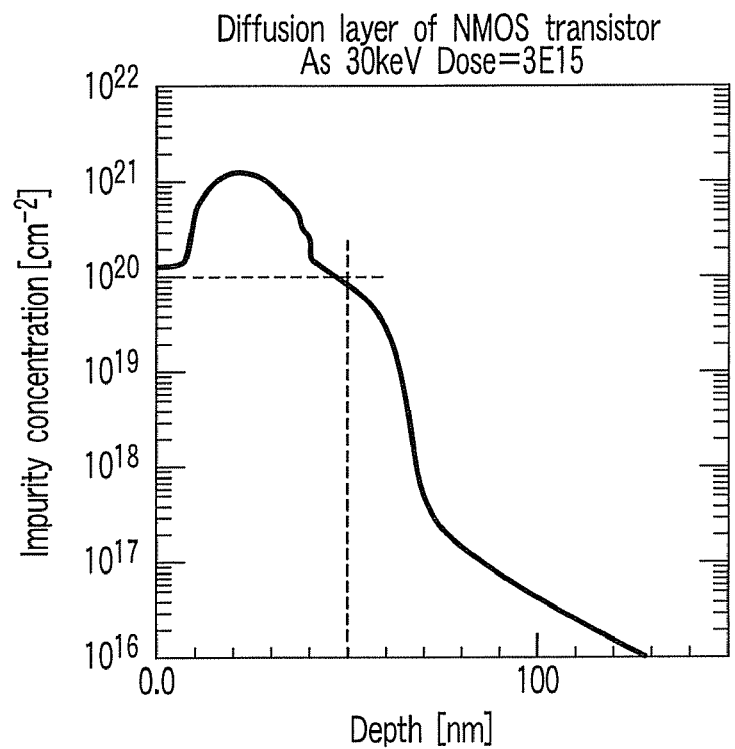
FIG. 5 is a graph showing the impurity profile in the direction of depth below a substrate in an n-type impurity diffusion layer of an NMOS transistor according to each embodiment of the present invention.

FIG. 5 shows the impurity profile in the direction of depth below the substrate in an n-type impurity diffusion layer of an NMOS transistor according to each embodiment of the present invention. This impurity profile is the result of simulation when ion-implanting $As^+$ at 30 keV and 3E15 $cm^{-2}$ and performing activation annealing.

As shown in FIG. 5, the impurity concentration in the n-type diffusion layer is highest near the substrate surface, and lowers as the depth from the substrate surface increases. This n-type diffusion layer ensures an impurity concentration of $10^{20}$ $cm^3$ or more to about 40 to 50 nm from the substrate surface. The high concentration region of maximum peak of the impurity concentration in the n-type diffusion layer is positioned at a depth of, e.g., about 25 to 30 nm from the surface of the semiconductor substrate 11.

The impurity profiles shown in FIGS. 3 to 5 as described above demonstrate that the p-type diffusion layer 27 in the region to be connected to the contact 33 is formed to have a deep impurity high concentration region (about 50 nm from the substrate surface) equal to that in the n-type diffusion layer.

FIGS. 6 to 13 are sectional views showing manufacturing steps of the semiconductor memory device having the PMOS transistor according to the first embodiment of the present invention. A method of manufacturing the semiconductor memory device having the PMOS transistor according to the first embodiment of the present invention will be explained below.

Figure 6:
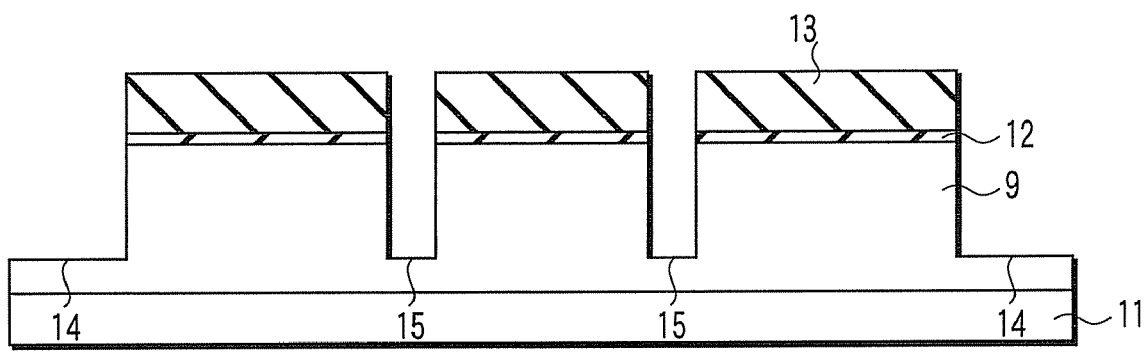

As shown in FIG. 6, an n-well layer 9 is formed by diffusing an n-type impurity such as phosphorus near the surface of a semiconductor substrate (silicon substrate) 11 in a prospective region of a PMOS transistor, and channel ion implantation for adjusting the threshold value is performed near the surface of the semiconductor substrate 11. A sacrificial oxide film 12 consisting of silicon oxide or the like is formed by oxidizing the surface of the semiconductor substrate 11. Then, a silicon nitride film 13 is deposited on the sacrificial oxide film 12 by means of chemical vapor deposition (CVD) or the like. A resist (not shown) is formed on the silicon nitride film 13, and holes are formed by means of lithography in regions corresponding to an element isolation insulating layer 16 and block layers 17 (to be described later). After that, the silicon nitride film 13, sacrificial oxide film 12, and semiconductor substrate 11 are sequentially etched by, e.g., about 250 nm, thereby forming a trench 14 and trenches 15 in the semiconductor substrate 11. The trench 14 is a trench for forming an element isolation insulating layer 16, and the trenches 15 are trenches for forming block layers 17. Although the trenches 14 and 15 may be formed in the same step of the process, they may also be separately formed in different steps.

Then, as shown in FIG. 7, silicon on the surfaces of the trenches 14 and 15 is oxidized by a few nm, and a silicon oxide film 19 is buried in the trenches 14 and 15 by means of CVD or the like. After that, the silicon oxide film 19 is removed from the surface of the silicon nitride film 13 and left behind in only the trenches 14 and 15 by means of chemical mechanical polishing (CMP) or the like. In this processing, the silicon nitride film 13 functions as a CMP stopper. In this way, an element isolation insulating layer 16 having the STI structure is formed in the trench 14, and block layers 17 are formed in the trenches 15. After that, the silicon nitride film 13 is removed with, e.g., phosphoric acid, the sacrificial oxide film 12 is removed with, e.g., an aqueous ammonium fluoride solution. In this processing, the upper portion of the element isolation insulating layer 16 and block layers 17 are also partially removed in some cases. Therefore, the corners of the upper surfaces of the element isolation insulating layer 16 and block layers 17 may also be rounded. In this case, there is no problem if a so-called field reversal can be prevented by the element separation insulation layer 16.

As shown in FIG. 8, a gate insulating film 18 consisting of silicon oxide or the like is formed on the surface of the semiconductor substrate 11 by oxidation. Subsequently, a phosphorus-doped polysilicon film 21 is deposited on the gate insulating film 18, element isolation insulating layer 16, and block layers 17, and a silicon nitride film 22 is deposited on the polysilicon film 21. The polysilicon film 21 serves as the material of a gate electrode G, and the silicon nitride film 22 serves as a mask material and a CMP stopper material.

As shown in FIG. 9, a resist (not shown) is patterned by means of lithography so as to remain in only the region of a gate electrode G, and the silicon nitride film 22 and polysilicon film 21 are etched away by means of reactive ion etching (RIE). After that, the resist is removed. As a result, a gate electrode G having the shape shown in FIG. 1 is formed.

Figure 10:
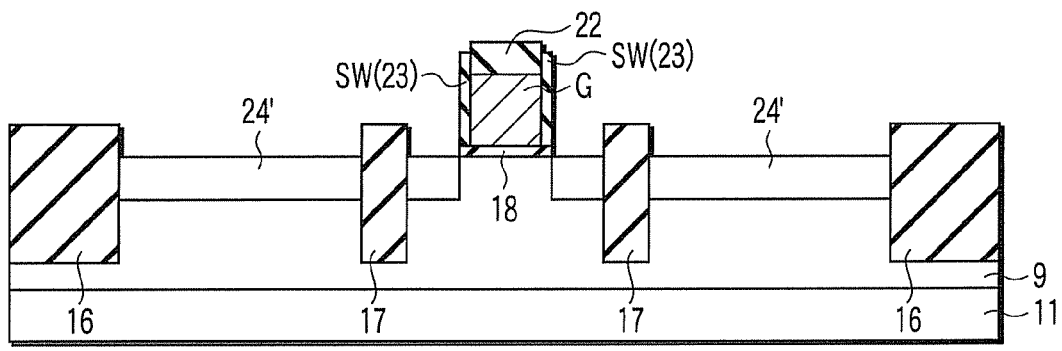

As shown in FIG. 10, a silicon oxide film 23 about 50 nm thick is deposited by means of CVD, and processed by means of non-masking RIE. Consequently, the silicon oxide film 23 remains only on the sidewalls of the gate electrode G, thereby forming sidewall insulating films SW. Then, a p-type impurity such as $BF_2^+$ is ion-implanted in the surface of the semiconductor substrate 11 at, e.g., 10 keV and 3E15 $cm^{-2}$ (first conditions), thereby forming impurity regions 24' in the surface of the semiconductor substrate 11.

A maximum peak of the p-type impurity concentration in the impurity regions 24' is positioned at a depth of, e.g., about 10 nm from the substrate surface. This decreases the depth of diffusion layers 24 after annealing. The diffusion layers 24 after annealing have the impurity profile as shown in FIG. 3. A process like this is used because boron as a p-type impurity has a large diffusion coefficient and hence readily worsens the short-channel effect of a PMOS transistor to design the device so as to prevent this inconvenience.

Figure 11:
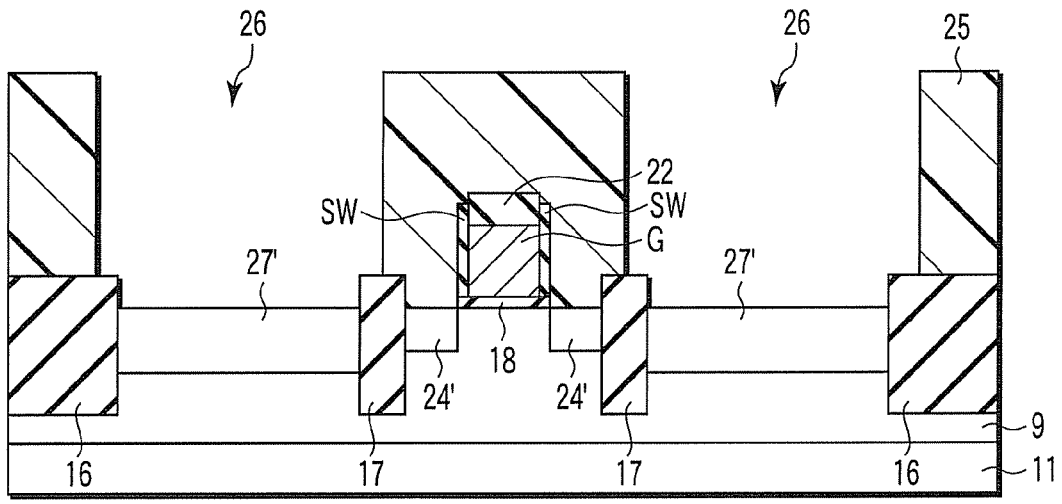

As shown in FIG. 11, a resist 25 is formed by means of coating, and holes 26 are formed in the resist 25 by means of lithography. The holes 26 are formed so as not to form any hole between the block layers 17 and gate electrode G. Subsequently, a p-type impurity such as $BF_2^+$ is ion-implanted in the surface of the semiconductor substrate 11 at, e.g., 30 keV and 2E15 $cm^{-2}$ (second conditions), thereby forming impurity regions 27' in the surface of the semiconductor substrate 11.

The impurity regions 27' are formed by making the acceleration energy higher than that in the formation of the impurity regions 24', so as to obtain an impurity high concentration region almost equal to that in the n-type diffusion layer of the NMOS transistor shown in FIG. 5. That is, ion implantation is performed such that a maximum peak of the impurity concentration in the impurity regions 27' is positioned at a depth of, e.g., about 30 nm from the substrate surface. Diffusion layers 27 after this annealing have the impurity profile as shown in FIG. 4.

Figure 12:
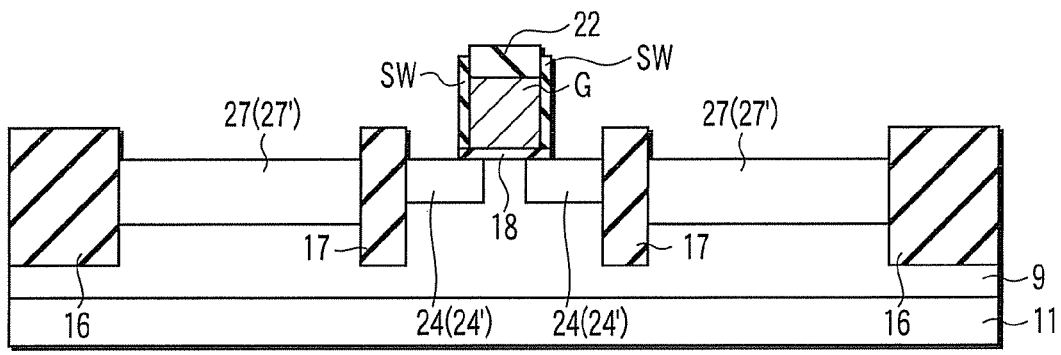

As shown in FIG. 12, activation annealing is performed on the p-type impurity regions 24' and 27' at, e.g., 950° C. for, e.g., about 10 sec, thereby forming diffusion layers 24 and 27 in the surface of the semiconductor substrate 11.

Figure 13:
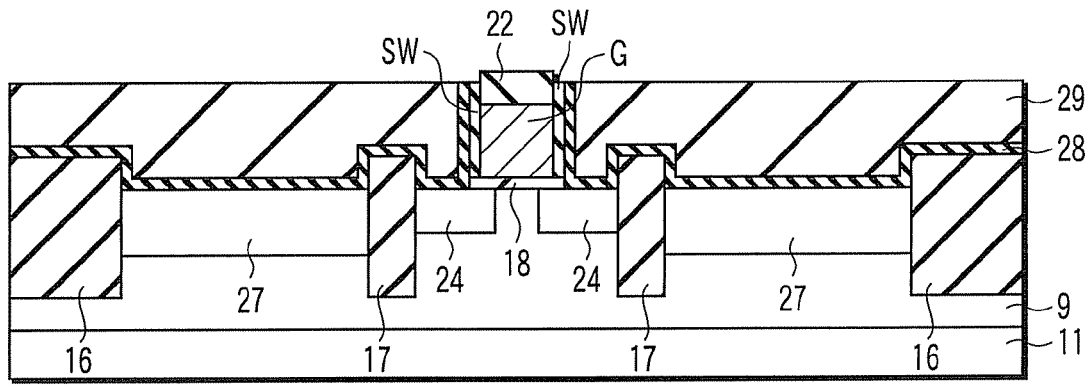

As shown in FIG. 13, a silicon nitride film 28 and an interlayer dielectric film 29 that is a silicon oxide film such as boron phosphorous silicate glass (BPSG) are deposited by means of CVD or the like. After that, unnecessary portions of the interlayer dielectric film 29 and silicon nitride film 28 are removed by means of CMP planarization, thereby exposing the silicon nitride film 22. The silicon nitride film 22 is then removed with phosphoric acid or by means of RIE.

Subsequently, as shown in FIGS. 1 and 2, a refractory metal such as cobalt is deposited by means of sputtering, and cobalt is brought into contact with polysilicon of the gate electrode G. Annealing is performed at a temperature of about 500° C. to cause polysilicon and cobalt to react with each other. Consequently, a silicide layer 30 consisting of CoSi is formed on the gate electrode G. Then, unnecessary unreacted cobalt is removed with a solution mixture of sulfuric acid and a hydrogen peroxide solution. After that, a low-resistance silicide layer 30 is formed by annealing at a temperature of about 800° C. A silicon nitride film 31 is deposited on the interlayer dielectric film 29 and silicide layer 30, and a silicon oxide film 32 is deposited on the silicon nitride film 31. Contact holes 33 that expose the diffusion layers 27 are formed by means of lithography and RIE, and interconnection trenches 34 are formed in the silicon oxide film 32. Note that when forming the contact holes 33, the surfaces of the diffusion layers 27 are sometimes overetched by about 20 nm from the substrate surface. Subsequently, a barrier metal film (not shown) consisting of Ti, TiN, or stacked Ti and TiN is formed in the contact holes 33 and interconnection trenches 34. A metal such as tungsten is deposited on this barrier metal film by means of sputtering or CVD, and buried in the contact holes 33 and interconnection trenches 34. The metal material and barrier metal film are then removed by means of CMP, thereby forming contacts 33 and upper interconnection layers 36. By the above steps, the semiconductor memory device having the PMOS transistor PTr is completed.

The first embodiment described above can achieve the following effects.

When forming the contact holes 33, the silicon oxide films 29 and 32 and silicon nitride films 28 and 31 are basically etched by means of RIE. At this time, the overetching dose semiconductor substrate 11 to secure the opening yield. This RIE is generally performed under conditions by which the etching rate of the silicon oxide films 29 and 32 and silicon nitride films 28 and 31 is naturally high, and that of silicon is low. At the opening of the contact hole 33, however, the etching amount of the semiconductor substrate 11 cannot be reduced to zero, and the semiconductor substrate 11 is etched by about 20 nm.

In the formation of diffusion layer 27 around the contact hole 33 in the PMOS transistor PTr, however, the p-type impurity is additionally implanted to obtain maximum peak of the impurity concentration region at a depth of about 30 nm from maximum peak of the impurity concentration region (20 nm from the substrate surface) near the surface of the surface of the semiconductor substrate 11. This allows diffusion layer 27 to have a high concentration of $10^{20}$ cm$^{-3}$ or more to a depth of about 50 nm from the substrate surface. Therefore, even when the semiconductor substrate 11 is etched by about 20 nm and this etching depth varies during the formation of the contact hole 33 to be connected to the surface of diffusion layer 27, the decrease in impurity concentration in the surface of the opening can be suppressed because the high concentration region of the impurity concentration in diffusion layer 27 is deeper than the etching amount. This makes it possible to suppress the rise in resistance of the contact 35.

When forming the diffusion layers of the PMOS transistor, it is also possible to simply deeply implant the additional impurity around only the prospective region of the contact hole. However, the short-channel effect worsens if the heavily doped region is made close to the gate electrode by misalignment in the lithography that defines the region of the additional implantation. In contrast, although diffusion layer 27 is formed to be deeper than diffusion layer 24, this embodiment can prevent the short-channel effect from worsening because the block layer 17 is formed around diffusion layer 27, and the opening 17', which electrically connects the diffusion layers 24 and 27, of the block layer 17 does not oppose the gate electrode G.

Conventionally, to raise the concentration of a diffusion layer to be connected to a contact, a so-called rediffusion process in which an impurity having the same conductivity type as that of the diffusion layer is doped again and annealed is sometimes used after a contact hole is formed. As indicated by this embodiment, however, if a material such as CoSi weak against heat is used as the silicide layer on the gate electrode when the contact hole is formed, the rediffusion process is inapplicable because activation annealing at around 900° C. to 950° C. cannot be performed. In contrast, this embodiment makes it possible, without using the rediffusion process, to obtain the good electrical characteristics that raise the concentration in diffusion layer 27 to be connected to the contact 35.

Note that the above-mentioned first embodiment may be variously changed as follows.

Figure 14:
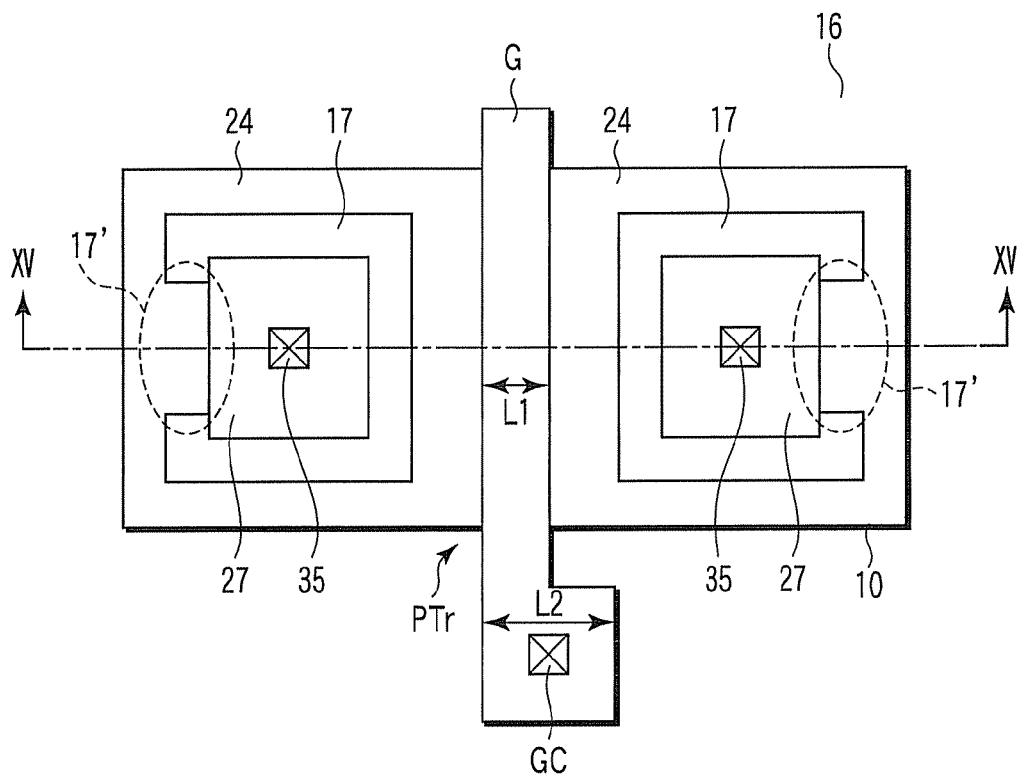
FIG. 14 is a schematic plan view of another semiconductor memory device having a PMOS transistor according to the first embodiment of the present invention.
Figure 15:
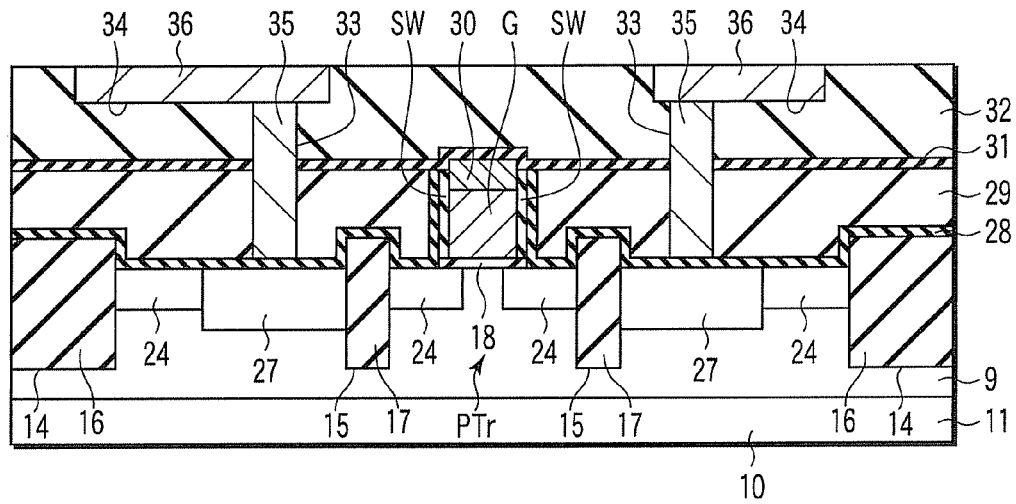
FIG. 15 is a sectional view taken along line XV-XV in FIG. 14.

(1) As shown in FIGS. 14 and 15, diffusion layer 27 may also be formed within the block layer 17 so as not to extend outside from the opening 17' of the block layer 17. Accordingly, diffusion layer 27 extends outside from the opening 17' and comes in contact with the element isolation insulating layer 16 in the structure shown in FIG. 2, whereas diffusion layer 27 is not in contact with the element isolation insulating layer 16 in the structure shown in FIG. 15.

Figure 16:
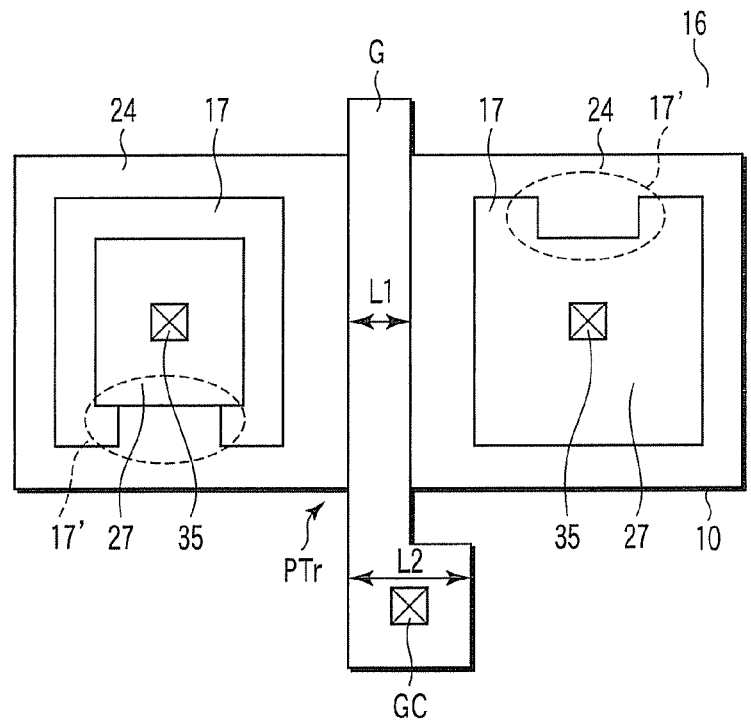
FIG. 16 is a schematic plan view of still another semiconductor memory device having a PMOS transistor according to the first embodiment of the present invention.

(2) As shown in FIG. 16, it is only necessary for the opening 17' of the block layer 17 not to oppose the gate electrode G.

Also, while the planar shape of the block layer 17 is symmetric with respect to the gate electrode G in FIG. 1, the planar shape of the block layer 17 may also be asymmetric with respect to the gate electrode G as shown in FIG. 16. For example, in the planar shape of the block layer 17, a left opening 17' faces in the gate electrode G is formed on the downside in the figure, and a right opening 17' faces in the gate electrode G is formed on the upside in the figure. By this shape, electric current course becomes short to the gate electrode G from contact 35, and the parasitic resistance between the source/drain of the transistor falls down.

Figure 17:
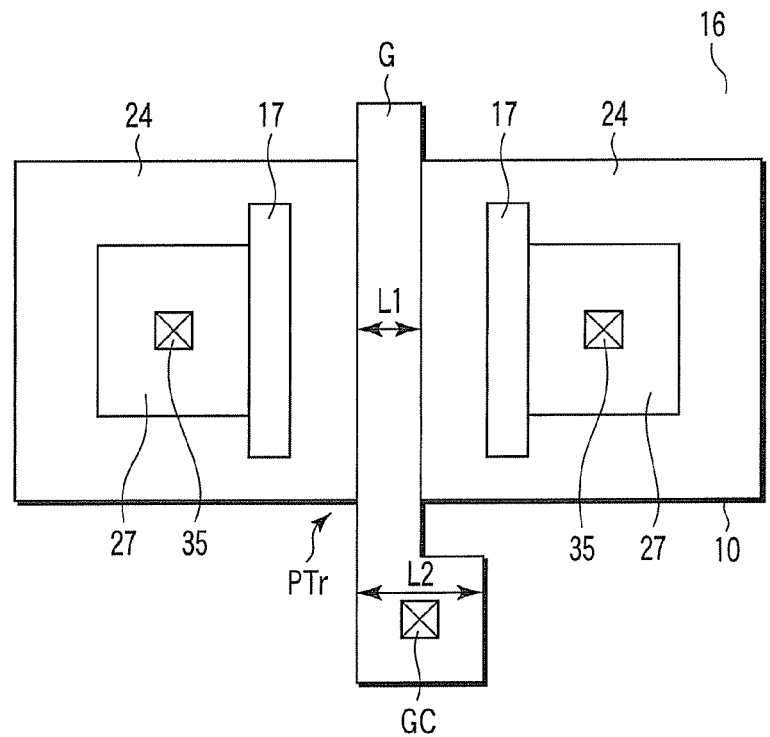
FIG. 17 is a schematic plan view of still another semiconductor memory device having a PMOS transistor according to the first embodiment of the present invention.

(3) As shown in FIG. 17, the planar shape of the block layer 17 may also be a linear shape parallel to the gate electrode G. In this case, the block layer 17 is desirably formed between diffusion layer 27 and the gate electrode G. By this shape, electric current course becomes short to the gate electrode G from contact 35, and the parasitic resistance between the source/drain of the transistor falls down.

Second Embodiment

The difference of the second embodiment from the first embodiment is the structure of a block layer. The second embodiment like this will be explained by taking a PMOS transistor used in a CMOS device or the like as an example. Note that an explanation of the same features as in the first embodiment will not be repeated.

Figure 18:
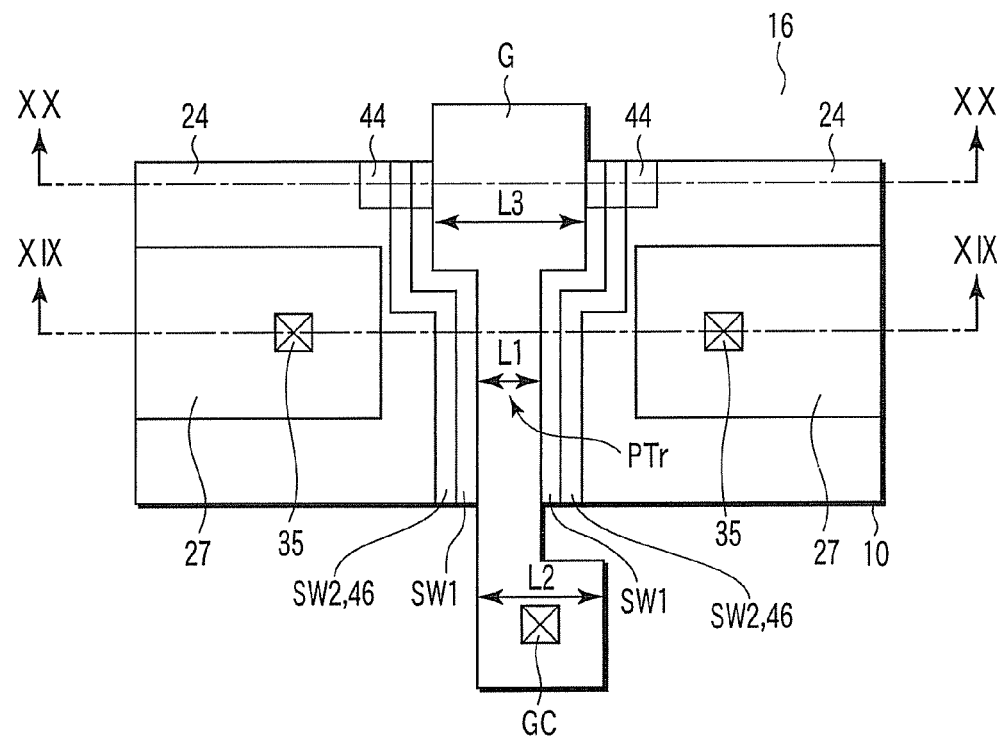
FIG. 18 is a schematic plan view of a semiconductor memory device having a PMOS transistor according to the second embodiment of the present invention.
Figure 19:
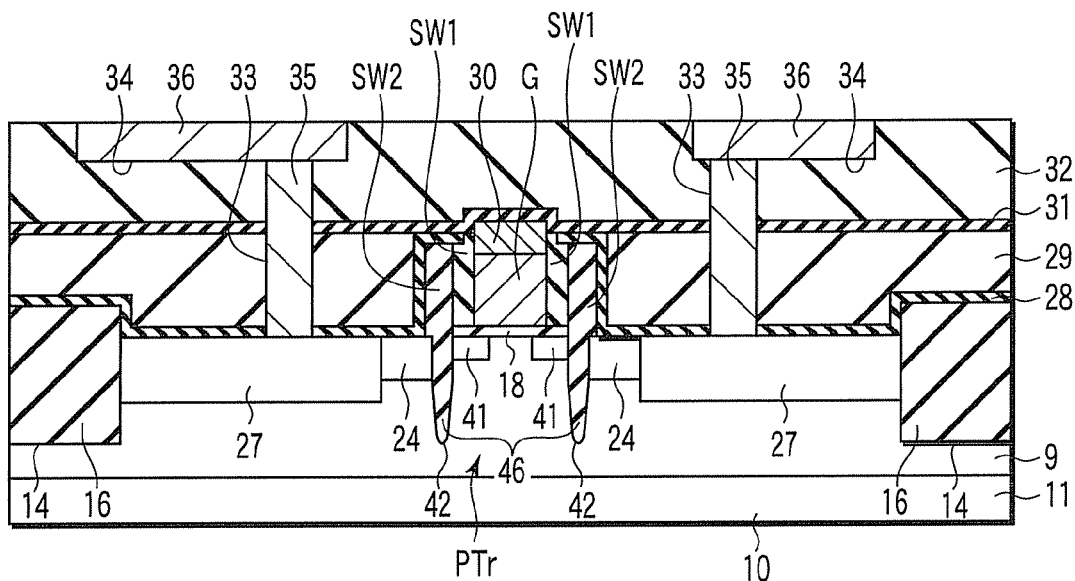
FIG. 19 is a sectional view taken along line XIX-XIX in FIG. 18.
Figure 20:
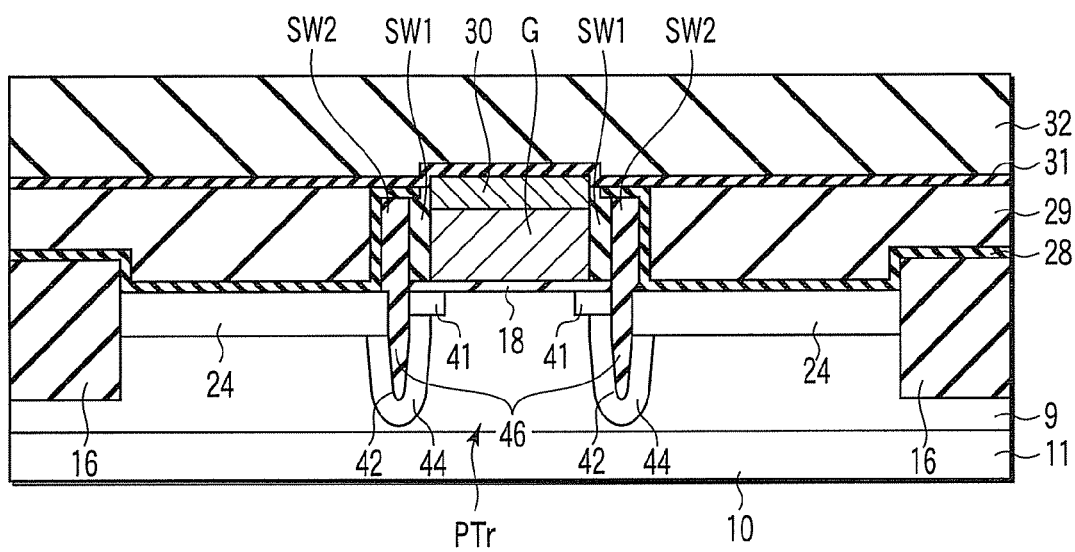
FIG. 20 is a sectional view taken along line XX-XX in FIG. 18.

FIG. 18 is a schematic plan view of a semiconductor memory device having a PMOS transistor according to the second embodiment of the present invention. FIG. 19 is a sectional view taken along line XIX-XIX in FIG. 18. FIG. 20 is a sectional view taken along line XX-XX in FIG. 18. The semiconductor memory device having the PMOS transistor according to the second embodiment will be explained below.

A gate electrode G of a PMOS transistor PTr is formed on a gate insulating film 18 on a semiconductor substrate 11. The gate electrode G extends onto an element isolation insulating layer 16 across an element region 10. One end portion of the gate electrode G is positioned on the element isolation insulating layer 16, and connected to a gate contact GC. The other end portion of the gate electrode G is positioned in the boundary between the element region 10 and element isolation insulating layer 16. Gate length L3 of the other end portion of the gate electrode G is greater than gate length L1 of the gate electrode G on the element region 10 in order to suppress the influence of the short-channel effect. Gate length L1 of the short portion is, e.g., about 0.2 to 0.4 µm, and gate length L3 of the long portion is, e.g., about 1 µm. Note that in a transistor not requiring a small gate length, a structure like this need not be formed, and the whole structure may have the same gate length.

First sidewall insulating films SW1 are formed on the side surfaces of the gate electrode G, and second sidewall insulating films SW2 are formed on the side surfaces of the first sidewall insulating films SW1. The first and second sidewall insulating films SW1 and SW2 are silicon oxide films or the like, and may consist of the same or different materials. The first sidewall insulating films SW1 desirably consist of the same material as does the gate insulating film 18, and desirably consist of a material (e.g., silicon oxide) having etching selectivity to silicon.

Trenches 42 are formed in the semiconductor substrate 11 below the second sidewall insulating films SW2, and block layers 46 are formed in the trenches 42. Each block layer 46 consists of the same insulating layer as does the second sidewall insulating film SW2, and is integrated with the second sidewall insulating film SW2. The block layer 46 narrows in the direction of depth of the semiconductor substrate 11. The block layer 46 extends parallel to the gate electrode G, and is in contact with the element isolation insulating layer 16. The block layer 46 may also consist of the same insulating layer as or an insulating layer different from the element isolation insulating layer 16. This embodiment, the bottom surface of the block layer 46 has a depth equal to that of the bottom surface of the element isolation insulating layer 16. For example, when the gate length of the PMOS transistor is comparatively long, the bottom of the block layer 46 may be made shallower than the bottom of the element isolation insulating layer 16.

A pair of diffusion layers 24 are formed by diffusing a p-type impurity such as boron or $BF_2$ in the surface of the semiconductor substrate 11 on the sides of the block layers 46 away from the gate electrode G. A pair of diffusion layers 27 are formed by diffusing a p-type impurity such as boron or $BF_2$ in partial regions of the diffusion layers 24. The diffusion layers 24 and 27 are electrically connected to each other by direct contact, and secure current paths without sandwiching any p-n junction. The impurity profiles of the diffusion layers 24 and 27 are the same as in the first embodiment described above as shown in FIGS. 3 and 4.

A pair of diffusion layers 41 are formed by diffusing a p-type impurity such as boron or $BF_2$ in the semiconductor substrate 11 below the first sidewall insulating films SW1. The diffusion layers 41 are formed to implement a so-called lightly doped drain (LDD) structure.

A pair of diffusion layers 44 are formed by diffusing a p-type impurity such as boron or $BF_2$ around portions of the block layers 46 in the semiconductor substrate 11 (FIGS. 18 and 20). The diffusion layers 44 exist in only the vicinity of the gate electrode G having gate length L3. Since the diffusion layers 24, 27, and 41 are formed to be shallower than the bottom surfaces of the block layers 46, the diffusion layers 24 and 41 are insulated by the block layers 46. On the other hand, the diffusion layers 44 are formed to contact with the bottom of the block layer 46, and the diffusion layers 24 and the diffusion layers 41 are connected. Furthermore, the diffusion layer 24, 41 and 44 have the same-type P impurities concentration. Accordingly, the diffusion layers 24 and 41 are electrically connected by the diffusion layers 44.

FIGS. 21 to 28 are sectional views and the like of manufacturing steps of the semiconductor memory device having the PMOS transistor according to the second embodiment of the present invention. A method of manufacturing the semiconductor memory device having the PMOS transistor according to the second embodiment will be explained below. Note that the explanation will mainly refer to sectional views taken along line XIX-XIX in FIG. 18, but sectional views or plan views taken along line XX-XX in FIG. 18 will also be referred to when necessary.

As shown in FIG. 21, an n-well layer 9 is formed by diffusing an n-type impurity such as phosphorus near the surface of a semiconductor substrate (silicon substrate) 11 in a prospective region of a PMOS transistor, and channel ion implantation for adjusting the threshold value is performed near the surface of the semiconductor substrate 11. A sacrificial oxide film 12 consisting of silicon oxide or the like is formed by oxidizing the surface of the semiconductor substrate 11. Then, a silicon nitride film 13 is deposited on the sacrificial oxide film 12 by means of CVD or the like. A resist (not shown) is formed on the silicon nitride film 13, and a hole is formed by means of lithography in a region corresponding to an element isolation insulating layer 16 (to be described later). After that, the silicon nitride film 13, sacrificial oxide film 12, and semiconductor substrate 11 are sequentially etched by, e.g., about 250 nm, thereby forming a trench 14 in the semiconductor substrate 11.

Then, as shown in FIG. 22, after silicon on the surface of the trench 14 is oxidized by a few nm, a silicon oxide film 19 is buried in the trench 14 by means of CVD or the like. After that, the silicon oxide film 19 is removed from the surface of the silicon nitride film 13 and left behind in only the trench 14 by means of CMP or the like. In this processing, the silicon nitride film 13 functions as a CMP stopper. In this way, an element isolation insulating layer 16 having the STI structure is formed in the trench 14. After that, the silicon nitride film 13 is removed with, e.g., phosphoric acid, and the sacrificial oxide film 12 is removed with, e.g., an aqueous ammonium fluoride solution. In this processing, the upper portion of the element isolation insulating layer 16 is also partially removed in some cases. Therefore, the corners of the upper portion of the element isolation insulating layer 16 may also be rounded. In this case, there is no problem if a so-called field reversal can be prevented by the element separation insulation layer 16.

As shown in FIG. 23, a gate insulating film 18 consisting of silicon oxide or the like is formed on the surface of the semiconductor substrate 11 by oxidation. Subsequently, a phosphorus-doped polysilicon film 21 is deposited on the gate insulating film 18 and element isolation insulating layer 16, and a silicon nitride film 22 is deposited on the polysilicon film 21. The polysilicon film 21 serves as the material of a gate electrode G, and the silicon nitride film 22 serves as a mask material and a CMP stopper material.

As shown in FIG. 24, a resist (not shown) is patterned by means of lithography so as to remain in only the region of a gate electrode G, and the silicon nitride film 22 and polysilicon film 21 are etched away by means of RIE. After that, the resist is removed. As a result, a gate electrode G having the shape shown in FIG. 18 is formed. Then, a post-oxidation step is performed. Subsequently, in order to form an LDD structure, a p-type impurity such as $BF_2^+$ is ion-implanted in the surface of the semiconductor substrate 11 at, e.g., 10 keV and $1E13\ cm^{-2}$, and activation annealing is performed. In this way, diffusion layers 41 are formed in the surface of the semiconductor substrate 11.

As shown in FIG. 25, a silicon oxide film 23 about 10 nm thick is deposited on the silicon nitride film 22, gate insulating film 18, and element isolation insulating layer 16. The silicon oxide film 23 covers the gate electrode G.

As shown in FIGS. 26A and 26B, the silicon oxide film 23 is etched back in a first etching step. The first etching step uses first etching conditions that increase the etching rate of portions below the step (in this embodiment, the side portions of the gate electrode G) by using the characteristics of RIE. The first etching conditions involve use of a gas containing, e.g., "a compound of fluorine, hydrogen, and carbon" or "a compound of fluorine and carbon". In the first etching step as described above, the silicon oxide film 23 and gate insulating film 18 below the step are removed earlier, so only the semiconductor substrate 11 below the step is exposed earlier. The silicon oxide film 23 remains on the side surfaces of the gate electrode G, thereby forming sidewall insulating films SW1.

Subsequently, a second etching step is performed using, e.g., a chamber different from that used in the first etching step. In the second etching step, the conditions are changed to second etching conditions that increase the etching rate of silicon and decrease that of a silicon oxide film. The second etching conditions are RIE conditions used to process the gate electrode G or the like, and involve use of a gas (e.g., a gas containing HBr) different from that used in the first etching conditions. When the semiconductor substrate 11 is etched under the second etching conditions, trenches 42 that narrow downward are formed in the semiconductor substrate 11. Note that in order to perform this etching, the films 18 and 23 desirably consist of the same material (e.g., silicon oxide) having high etching selectivity to silicon.

Figure 27A:
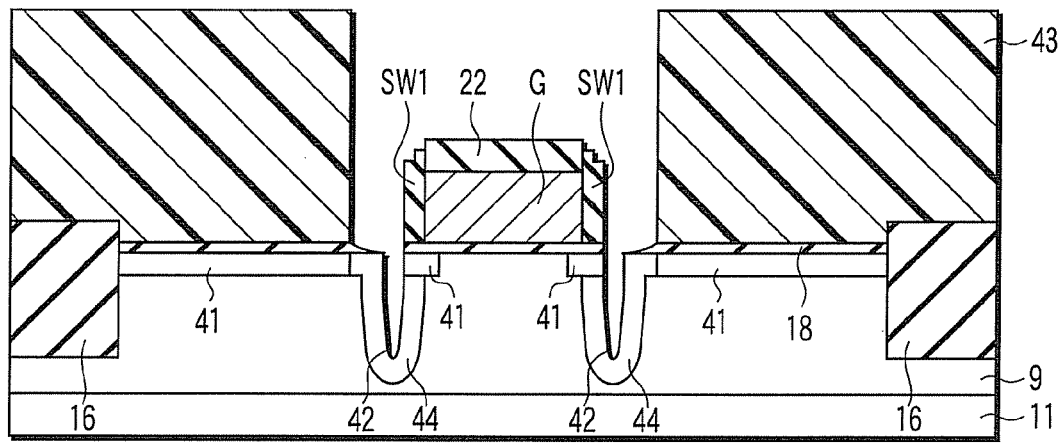
FIG. 27A is a sectional view following FIG. 26A and showing a manufacturing step of the semiconductor memory device having the PMOS transistor according to the second embodiment of the present invention.
Figure 27B:
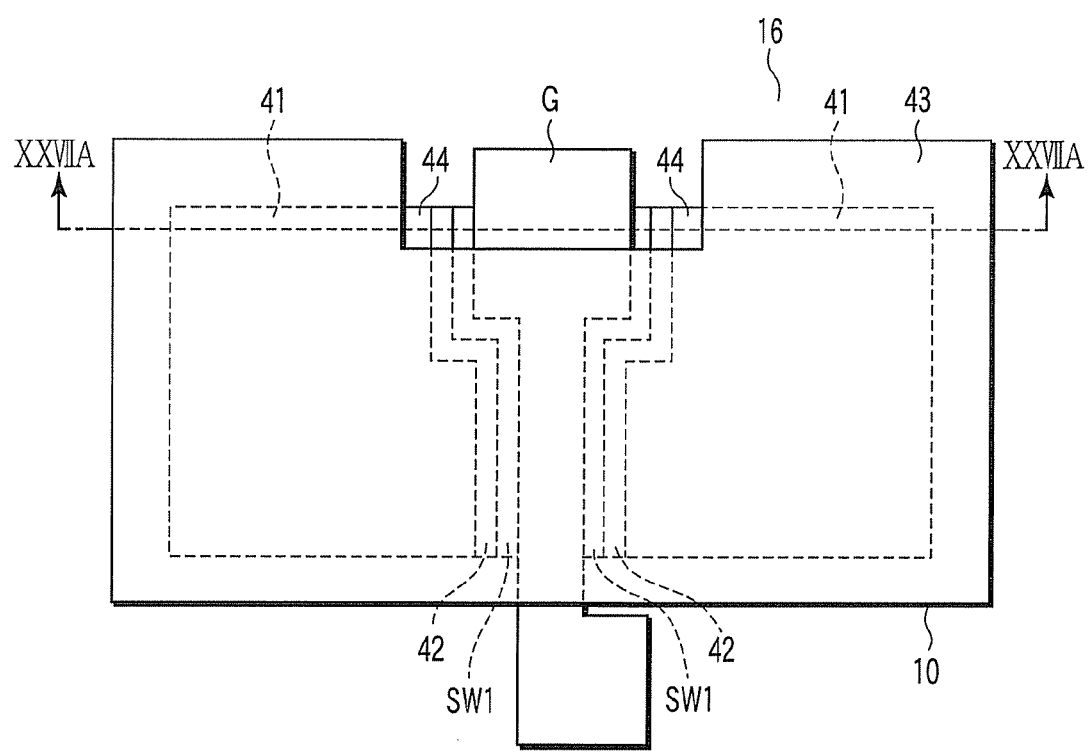
FIG. 27B is a plan view of FIG. 27A.

As shown in FIGS. 27A and 27B, a resist 43 is formed by means of lithography. The resist 43 is formed so that a wide portion (a portion having gate length L3) of the gate electrode G partially opens. Then, a p-type impurity such as $BF_2^+$ is ion-implanted in the surface of the semiconductor substrate 11 at, e.g., 10 keV and 1E15 $cm^{-2}$, and activation annealing is performed. In this way, diffusion layers 44 are formed around portions of the trenches 42. As the formation method of the diffusion layers 44, oblique ion implantation or the like may also be used. The impurities concentration of the diffusion layers 44 on the side of the trenches 42 becomes thick. After that, the resist 43 is removed with an asher and a solution of sulfuric acid and hydrogen peroxide.

Figure 28:
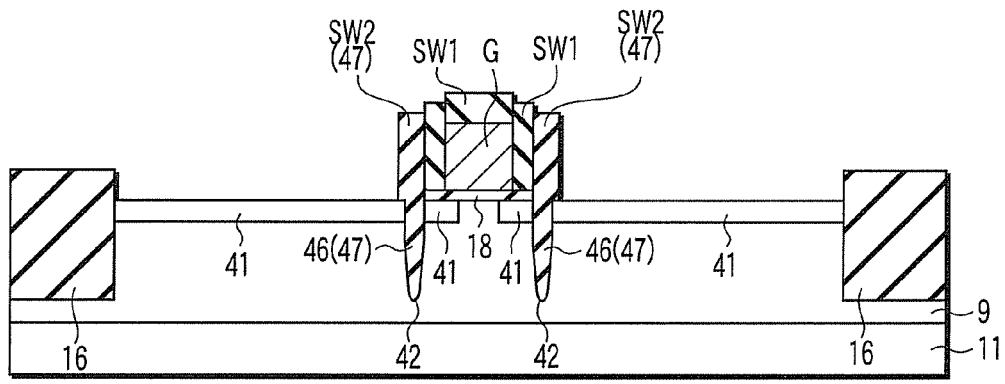
FIG. 28 is a sectional view following FIG. 27A and showing a manufacturing step of the semiconductor memory device having the PMOS transistor according to the second embodiment of the present invention.

As shown in FIG. 28, a sidewall material, e.g., a silicon oxide film 47 is deposited on the semiconductor substrate 11 and buried in the trenches 42 at the same time. Subsequently, the silicon oxide film 47 is etched back. In this way, sidewall insulating films SW2 are formed on the silicon oxide films 23 on the side surfaces of the gate electrode G, and block layers 46 are formed in the trenches 42.

Figure 29:
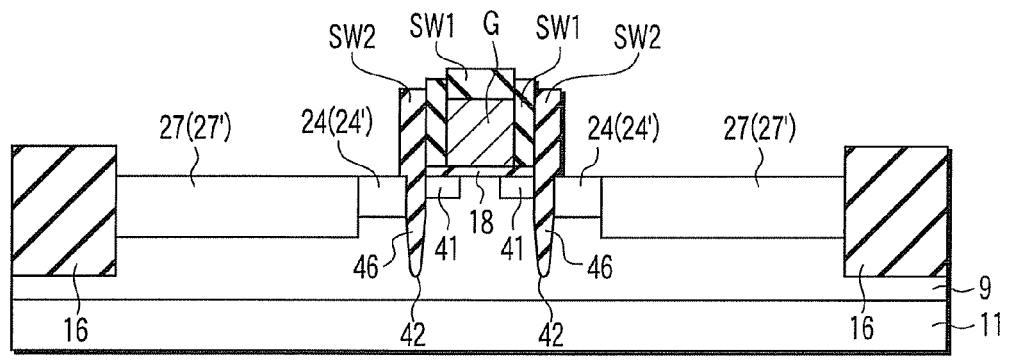
FIG. 29 is a sectional view following FIG. 28 and showing a manufacturing step of the semiconductor memory device having the PMOS transistor according to the second embodiment of the present invention.

As shown in FIG. 29, a p-type impurity such as $BF_2^+$ is ion-implanted in the surface of the semiconductor substrate 11 at, e.g., 10 keV and 3E15 $cm^{-2}$ (first conditions), thereby forming impurity regions 24' in the surface of the semiconductor substrate 11. Then, a resist (not shown) is used as a mask to ion-implant a p-type impurity such as $BF_2^+$ in the surface of the semiconductor substrate 11 at, e.g., 30 keV and 2E15 $cm^{-2}$ (second conditions), thereby forming impurity regions 27' in the surface of the semiconductor substrate 11. Activation annealing is then performed on the p-type impurity regions 24' and 27' at, e.g., 950° C. for, e.g., about 10 sec. In this way, diffusion layers 24 and 27 are formed in the surface of the semiconductor substrate 11. Note that details of the formation of the diffusion layers 24 and 27 are the same as in the first embodiment, and the diffusion layers 24 and 27 respectively have the impurity profiles shown in FIGS. 3 and 4.

As shown in FIGS. 18 to 20, a silicon nitride film 28 and interlayer dielectric film 29 are deposited by means of CVD or the like. After that, the silicon nitride film 22 is exposed by means of CMP planarization, and removed with phosphoric acid or by means of RIE. Then, a refractory metal such as cobalt is deposited by means of sputtering and annealed, thereby forming a silicide layer 30 consisting of CoSi on the gate electrode G. Unnecessary unreacted cobalt is removed, and annealing is performed at about 80° C. A silicon nitride film 31 is deposited on the interlayer dielectric film 29 and silicide layer 30, and a silicon oxide film 32 is deposited on the silicon nitride film 31. Contact holes 33 that expose the diffusion layers 27 are formed by means of lithography and RIE, and interconnection trenches 34 are formed in the silicon oxide film 32. Subsequently, a barrier metal film (not shown) is formed in the contact holes 33 and interconnection trenches 34. A metal material is deposited on this barrier metal film and buried in the contact holes 33 and interconnection trenches 34. The metal material and barrier metal film are removed by means of CMP, thereby forming contacts 35 and upper interconnection layers 36. By the above steps, the semiconductor memory device having the PMOS transistor PTr is completed.

In the second embodiment described above, as in the first embodiment, diffusion layer 27 having a high-concentration impurity profile of $10^{20}$ $cm^{-3}$ or more is formed to a depth of about 50 nm from the substrate surface in the region to be connected to the contact 35. Therefore, even when the semiconductor substrate 11 is etched during the formation of the contact hole 33 to be connected to the surface of diffusion layer 27, the decrease in impurity concentration in the surface of the opening can be suppressed because the high concentration region of the impurity concentration in diffusion layer 27 is deeper than the etching amount. This makes it possible to suppress the rise in resistance of the contact 35.

Also, in this embodiment, the trench 42 is formed from one end to the other of the element region 10 in the gate width direction (perpendicular to the gate length) of the gate electrode G. In this state, therefore, the diffusion layers 24 and 27 are not electrically connected to diffusion layer 41 on the side of the gate electrode G because a p-n junction is sandwiched between diffusion layer 41 and the diffusion layers 24 and 27. In this embodiment, however, diffusion layer 44 is formed around a portion of the trench 42. This makes it possible to electrically connect the diffusion layers 24 and 27 to diffusion layer 41. In this electrical connection region, the diffusion layer 44 is deep. However, the bad influence of the short-channel effect can be avoided by increasing gate length L3 to about 1 μm.

Note that the above-mentioned second embodiment may be variously changed as follows.

Figure 30:
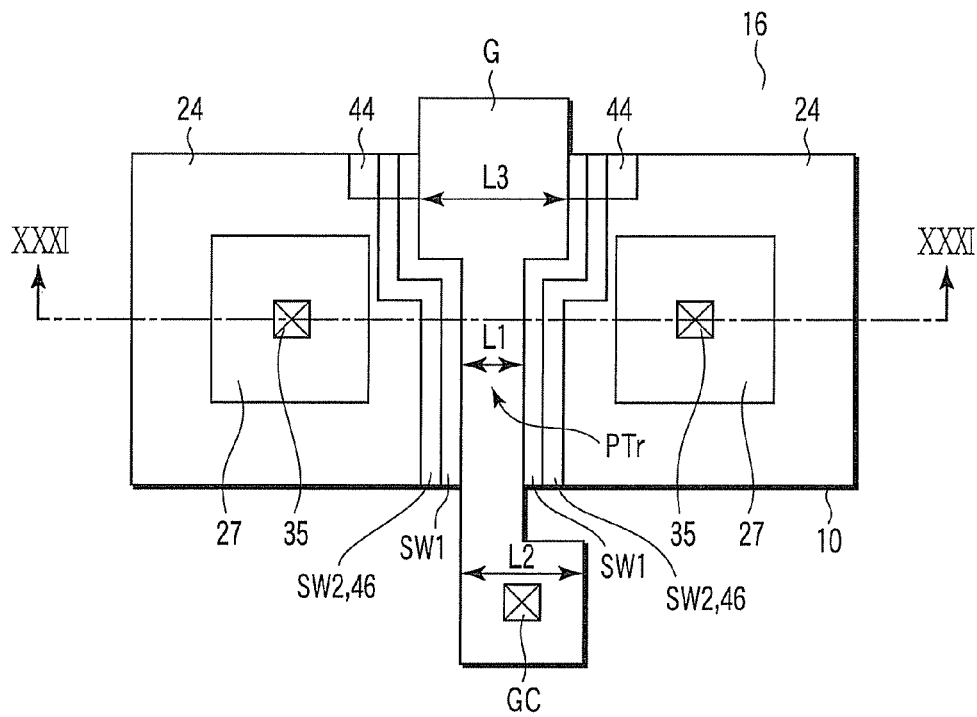
FIG. 30 is a schematic plan view of another semiconductor memory device having a PMOS transistor according to the second embodiment of the present invention.

As shown in FIGS. 30 and 31, the diffusion layers 27 may also be formed within the diffusion layers 24. Accordingly, portions of the diffusion layers 27 are in contact with the element isolation insulating layer 16 in the structure shown in FIG. 18, whereas the diffusion layers 27 are not in contact with the element isolation insulating layer 16 in the structure shown in FIG. 30. A distance with the bottom of the element isolation insulating layer 16 and the bottom of the diffusion layer becomes long, and leakage electric current to the element which adjoins it through the bottom of the element isolation insulating layer 16 can be reduced as that result.

Third Embodiment

The third embodiment is an example in which the structure of the first embodiment is applied to a peripheral circuit transistor or selection gate transistor of, e.g., a NAND flash memory. In the third embodiment, an explanation of the same features as in the first will not be repeated. Note that the structure of the second embodiment may also be applied to the flash memory of the third embodiment.

FIG. 32 is a sectional view of a semiconductor memory device of the flash memory according to the third embodiment of the present invention. The semiconductor memory device of the flash memory according to the third embodiment of the present invention will be explained below.

As shown in FIG. 32, the difference of the third embodiment from the first embodiment is the structure of a gate electrode G. That is, the gate electrode G of the third embodiment comprises a first gate electrode layer 51, a second gate electrode layer 53, and an inter-electrode insulating film 52 formed between the first and second gate electrode layers 51 and 53. An opening 54 for electrically connecting the first and second gate electrode layers 51 and 53 is formed in the inter-electrode insulating film 52. A trench 55 having the same shape as that of the opening 54 is formed in the first gate electrode layer 51 below the opening 54. The second gate electrode layer 53 is buried in the trench 55.

Note that the first gate electrode layer 51 functions as the floating gate of a memory cell transistor, and the second gate electrode layer 51 functions as the control gate of the memory cell transistor.

The third embodiment described above can achieve the same effects as in the first embodiment.

Fourth Embodiment

The fourth embodiment is a semiconductor memory device used in a CMOS device or the like, and is an example in which a PMOS transistor PTr and NMOS transistor NTr are formed on the same substrate.

As the PMOS transistor PTr of this embodiment, the PMOS transistor PTr explained in each embodiment is applied. As the NMOS transistor NTr of this embodiment, it is possible to apply the same structure as that of the PMOS transistor PTr explained in each embodiment, or a different structure (e.g., the existing structure). Even in the existing structure, As often used to form diffusion layers of the NMOS transistor NTr has a diffusion coefficient smaller than that of boron (i.e., has a diffusion rate lower than that of boron). When As is ion-implanted in a semiconductor substrate, therefore, diffusion layers can be formed such that maximum peak of the concentration region exists to a depth of about 30 nm (FIG. 5), as in the diffusion layers 27 of the PMOS transistor PTr.

In the existing structure of the NMOS transistor NTr, the block layers and the like of each embodiment do not exist. For example, a p-type well layer is formed in a semiconductor substrate, and a gate electrode is formed on a gate insulating film on the semiconductor substrate. N-type impurity diffusion layers are formed in the semiconductor substrate on the two sides of the gate electrode, and contacts are connected to the impurity diffusion layers. Similar to the diffusion layers 27 of the PMOS transistor PTr of each embodiment, the n-type impurity diffusion layers can hold an impurity concentration of $10^{20}$ cm$^{-3}$ or more to a depth of about 50 nm from the substrate surface (FIG. 5).

In the fourth embodiment described above, even when contact holes 33 are simultaneously formed on the diffusion layers 27 of the PMOS transistor PTr and NMOS transistor NTr on the same substrate, it is possible to prevent the rise and variation in resistance of contacts to the diffusion layers 27 in both transistors, because the high concentration region of the impurity concentration in the diffusion layers 27 exists in a deep position in both transistors. This makes it possible to form good contacts in both the NMOS transistor NTr and PMOS transistor PTr within the same chip, and prevent the short-channel effect of the transistors from worsening.

Note that the above embodiments include the following modes:

(1) A semiconductor memory device according to a mode of the present invention comprises a semiconductor substrate having a trench, a well layer having a first conductivity type and formed in the semiconductor substrate, a block layer formed in the trench and consisting of an insulating layer, a gate electrode formed on the semiconductor substrate apart from the block layer, a first diffusion layer having a second conductivity type, formed on the surface of the semiconductor substrate, and having a high concentration region of an impurity concentration to a first depth from the surface of the semiconductor substrate, a second diffusion layer having the second conductivity type, formed on the surface of the semiconductor substrate on the side of the block layer away from the gate electrode, having a high concentration region of an impurity concentration to a second depth greater than the first depth from the surface of the semiconductor substrate, and electrically connected to the first diffusion layer in contact with it, and a contact connected to the second diffusion layer.

(2) In mode (1), the upper surface of the block layer protrudes from the upper surface of the semiconductor substrate (e.g., FIG. 2).

(3) The semiconductor memory device according to mode (1) further comprises an element isolation insulating layer formed in the semiconductor substrate, and having a bottom surface at the same depth as that of the bottom surface of the block layer (e.g., FIG. 2).

(4) In mode (1), the planar shape of the block layer is a U-shape (e.g., FIG. 1).

(5) In mode (1), the planar shape of the block layer is linear (e.g., FIG. 17).

(6) The semiconductor memory device according to mode (1) further comprises a first sidewall insulating film formed on the side surface of the gate electrode, a second sidewall insulating film formed on the side surface of the first sidewall insulating film, a third diffusion layer formed on the surface of the semiconductor substrate below the first sidewall insulating film, and a fourth diffusion layer formed around a portion of the block layer in the semiconductor substrate, and configured to electrically connect the first diffusion layer and the third diffusion layer (e.g., FIGS. 18 to 20).

(7) In mode (6), the second sidewall insulating film consists of the insulating layer (e.g., FIGS. 18 to 20).

(8) In mode (6), the gate length of the gate electrode adjacent to the fourth diffusion layer is greater than that of the gate electrode which is not adjacent to the fourth diffusion layer (e.g., FIG. 18).

(9) In mode (6), the block layer narrows in the direction of depth of the semiconductor substrate (e.g., FIGS. 19 and 20).

(10) In mode (1), a transistor having the first conductivity type and a transistor having the second conductivity type and including the gate electrode are formed on the same semiconductor substrate, and the transistor having the first conductivity type comprises a well layer having the second conductivity type and formed in the semiconductor substrate, a gate electrode formed on the semiconductor substrate, a third diffusion layer having the first conductivity type, formed on the surface of the semiconductor substrate, and having a high concentration region of an impurity concentration to the second depth from the surface of the semiconductor substrate, and a contact connected to the third diffusion layer.

(11) A semiconductor memory device manufacturing method according to a mode of the present invention comprises steps of forming a well layer having a first conductivity type in a semiconductor substrate, forming a trench in the semiconductor substrate, forming a block layer by burying an insulating layer in the trench, forming a gate electrode on a gate insulating film on the semiconductor substrate apart from the block layer, forming, in the surface of the semiconductor substrate, a first diffusion layer having a second conductivity type and having a high concentration region of an impurity concentration to a first depth from the surface of the semiconductor substrate, forming, in the surface of the semiconductor substrate on the side of the block layer away from the gate electrode, a second diffusion layer having the second conductivity type and having a high concentration region of an impurity concentration to a second depth greater than the first depth from the surface of the semiconductor substrate, and forming a contact connecting to the second diffusion layer (e.g., FIGS. 1 to 13).

(12) A semiconductor memory device manufacturing method according to a mode of the present invention comprises steps of forming a well layer having a first conductivity type in a semiconductor substrate, forming a gate electrode on a gate insulating film on the semiconductor substrate, forming a first diffusion layer having a second conductivity type in the surface of the semiconductor substrate, forming a first insulating layer on the semiconductor substrate and the gate electrode, forming a first sidewall insulating film on the side surface of the gate electrode by etching the first insulating layer, forming a trench in the semiconductor substrate by etching the semiconductor substrate on the side of the gate electrode, forming a second diffusion layer having the second conductivity type around a portion of the trench in the semiconductor substrate, forming a second sidewall insulating film consisting of a second insulating layer on the side surface of the first sidewall insulating film, and forming a block layer consisting of the second insulating layer in the trench, forming, in the surface of the semiconductor substrate on the side of the block layer away from the gate electrode, a third diffusion layer having the second conductivity type and having a high concentration region of an impurity concentration to a first depth from the surface of the semiconductor substrate, forming, in a partial region of the third diffusion layer, a fourth diffusion layer having the second conductivity type and having a high concentration region of an impurity concentration to a second depth greater than the first depth from the surface of the semiconductor substrate, and forming a contact connecting to the fourth diffusion layer (e.g., FIGS. 18 to 29).

(13) In modes (11) and (12), the first conductivity type is an n-type, and the second conductivity type is a p-type.

(14) In modes (11) and (12), the first depth is 20 nm from the surface of the semiconductor substrate, and the second depth is 50 nm from the surface of the semiconductor substrate.

(15) In mode (12), the trench is formed by exposing only the surface of the semiconductor substrate on the side of the gate electrode when etching the first insulating layer (e.g., FIG. 26).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate having a trench;
    a well layer having a first conductivity type and formed in the semiconductor substrate;
    a block layer formed in the trench of the well layer and formed of an insulating layer, the block layer having a linear shape when viewed from a main surface of the semiconductor substrate;
    a gate electrode formed on the semiconductor substrate apart from the block layer, the block layer extending parallel to the gate electrode;
    a first diffusion layer having a second conductivity type, formed in a surface of the well layer, and having a high concentration region of an impurity concentration to a first depth from a surface of the semiconductor substrate;
    a second diffusion layer having the second conductivity type, formed in the surface of the well layer on a side of the block layer away from the gate electrode, having a high concentration region of an impurity concentration to a second depth greater than the first depth from the surface of the semiconductor substrate, and electrically connected to the first diffusion layer in contact therewith, the first diffusion layer is separated from the second diffusion layer by the well layer under a bottom of the block layer; and
    a contact connected to the second diffusion layer.

2. The device according to claim 1, wherein the first conductivity type is an n-type, and the second conductivity type is a p-type.

3. The device according to claim 1, wherein the first depth is 20 nm from the surface of the semiconductor substrate, and the second depth is 50 nm from the surface of the semiconductor substrate.

4. The device according to claim 1, wherein the second diffusion layer is separated from the first diffusion layer by the block layer, and electrically connected to the first diffusion layer in contact therewith in a region where the second diffusion layer does not oppose the gate electrode.

5. The device according to claim 1, wherein an upper surface of the block layer protrudes from an upper surface of the semiconductor substrate.

6. The device according to claim 1, further comprising an element isolation insulating layer formed in the semiconductor substrate, and having a bottom surface at the same depth as that of a bottom surface of the block layer.

7. The device according to claim 1, wherein a planar shape of the block layer is a U-shape.

8. The device according to claim 1, further comprising:
    a first sidewall insulating film formed on a side surface of the gate electrode;
    a second sidewall insulating film formed on a side surface of the first sidewall insulating film;
    a third diffusion layer formed on the surface of the semiconductor substrate below the first sidewall insulating film; and
    a fourth diffusion layer formed around a portion of the block layer in the semiconductor substrate, and configured to electrically connect the first diffusion layer and the third diffusion layer.

9. The device according to claim 8, wherein the second sidewall insulating film consists of the insulating layer.

10. The device according to claim 8, wherein a gate length of the gate electrode adjacent to the fourth diffusion layer is greater than that of the gate electrode which is not adjacent to the fourth diffusion layer.

11. The device according to claim 8, wherein the block layer narrows in a direction of depth of the semiconductor substrate.

12. The device according to claim 1, wherein the gate electrode is a gate electrode of one of a peripheral circuit transistor and a selection gate transistor of a NAND flash memory.

13. The device according to claim 1, wherein the first diffusion layer is connected to the second diffusion layer at a position further from the gate electrode than a side opposite to a gate electrode side of the block layer, when viewed from the main surface of the semiconductor substrate.

* * * * *